United States Patent
Miyamoto et al.

(10) Patent No.: US 11,978,997 B2
(45) Date of Patent: May 7, 2024

(54) LASER APPARATUS AND ELECTRONIC DEVICE MANUFACTURING METHOD

(71) Applicant: Gigaphoton Inc., Tochigi (JP)

(72) Inventors: Hirotaka Miyamoto, Oyama (JP);
Takuma Yamanaka, Oyama (JP);
Miwa Igarashi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 331 days.

(21) Appl. No.: 17/398,084

(22) Filed: Aug. 10, 2021

(65) Prior Publication Data
US 2021/0367396 A1 Nov. 25, 2021

Related U.S. Application Data

(63) Continuation of application No. PCT/JP2019/010245, filed on Mar. 13, 2019.

(51) Int. Cl.
| | |
|---|---|
| *H01S 3/13* | (2006.01) |
| *G03F 7/00* | (2006.01) |
| *H01S 3/038* | (2006.01) |
| *H01S 3/08* | (2023.01) |
| *H01S 3/137* | (2006.01) |

(52) U.S. Cl.
CPC ........ *H01S 3/1305* (2013.01); *G03F 7/70025* (2013.01); *H01S 3/038* (2013.01); *H01S 3/08009* (2013.01); *H01S 3/137* (2013.01)

(58) Field of Classification Search
CPC .......................... H01S 3/08009; H01S 3/1305
See application file for complete search history.

(56) References Cited

U.S. PATENT DOCUMENTS

6,529,531 B1 * 3/2003 Everage .............. G03F 7/70933
372/20
8,624,209 B1 1/2014 Rafac et al.
(Continued)

FOREIGN PATENT DOCUMENTS

CN 104868355 A 8/2015
CN 107112712 A 8/2017
(Continued)

OTHER PUBLICATIONS

Machine translation of CN 108493751 A (Year: 2023).*
(Continued)

*Primary Examiner* — Steven Whitesell Gordon
(74) *Attorney, Agent, or Firm* — Studebaker & Brackett PC

(57) ABSTRACT

A laser apparatus includes an output coupling mirror; a grating that constitutes an optical resonator together with the output coupling mirror; a laser chamber in an optical path of the optical resonator; at least one prism in an optical path between the laser chamber and the grating; a rotary stage including an actuator that rotates the prism to change an incident angle of a laser beam from the laser chamber on the grating; a wavelength measuring unit that measures a central wavelength of the laser beam from the laser chamber through the output coupling mirror; an angle sensor that detects a rotation angle of the prism; a first control unit that controls the actuator at a first operation frequency; and a second control unit that controls the actuator at a second operation frequency.

4 Claims, 20 Drawing Sheets

(56) References Cited

U.S. PATENT DOCUMENTS

| | | | |
|---|---|---|---|
| 2002/0141464 A1* | 10/2002 | Bushida | H01S 3/139 372/32 |
| 2006/0114957 A1 | 6/2006 | Algots et al. | |
| 2015/0380893 A1* | 12/2015 | Matsunaga | H01S 3/137 372/20 |
| 2017/0184453 A1 | 6/2017 | Wang et al. | |
| 2017/0222391 A1 | 8/2017 | Moriya et al. | |
| 2018/0041000 A1* | 2/2018 | Miyamoto | G02B 17/004 |
| 2019/0137064 A1 | 5/2019 | Zozgornik | |
| 2020/0014168 A1 | 1/2020 | Matsumoto et al. | |

FOREIGN PATENT DOCUMENTS

| | | | |
|---|---|---|---|
| CN | 108493751 A | * | 9/2018 |
| CN | 108493751 A | | 9/2018 |
| CN | 108700461 A | | 10/2018 |
| CN | 109073169 A | | 12/2018 |
| JP | H03-245583 A | | 11/1991 |
| JP | H09-214040 A | | 8/1997 |
| JP | 2008-522439 A | | 6/2008 |
| JP | 2016-139135 A | | 8/2016 |
| WO | 99/46836 A1 | | 9/1999 |
| WO | 2018/198215 A1 | | 11/2018 |

OTHER PUBLICATIONS

A Search Report mailed by China National Intellectual Property Administration dated May 24, 2023, which corresponds to Chinese Patent Application No. 201980091041.7 and is related to U.S. Appl. No. 17/398,084; with English language translation.

International Search Report issued in PCT/JP2019/010245; dated Jun. 4, 2019.

International Preliminary Report on Patentability and Written Opinion issued in PCT/JP2019/010245; dated Aug. 25, 2021.

* cited by examiner

US 11,978,997 B2

LASER APPARATUS AND ELECTRONIC DEVICE MANUFACTURING METHOD

CROSS-REFERENCE TO RELATED APPLICATIONS

The present application is a continuation application of International Application No. PCT/JP2019/010245, filed on Mar. 13, 2019, the entire contents of which are hereby incorporated by reference.

BACKGROUND

1. Technical Field

The present disclosure relates to a laser apparatus and an electronic device manufacturing method.

2. Related Art

Improvement in resolution of semiconductor exposure apparatuses has been desired due to miniaturization and high integration of semiconductor integrated circuits. Hereinafter, a semiconductor exposure apparatus is simply referred to as an "exposure apparatus." For this purpose, exposure light sources that output light with shorter wavelengths have been developed. A gas laser apparatus is used as an exposure light source in place of a conventional mercury lamp. As the gas laser apparatus for exposure, a KrF excimer laser apparatus that outputs ultraviolet light having a wavelength of 248 nm and an ArF excimer laser apparatus that outputs ultraviolet light having a wavelength of 193 nm are currently used.

As current exposure technology, immersion exposure is practically used in which a gap between a projection lens of an exposure apparatus and a wafer is filled with a liquid and a refractive index of the gap is changed to shorten an apparent wavelength of light from an exposure light source. When the immersion exposure is performed using the ArF excimer laser apparatus as the exposure light source, the wafer is irradiated with ultraviolet light having a wavelength of 134 nm in water. This technology is referred to as ArF immersion exposure. ArF immersion exposure is also referred to as ArF immersion lithography).

The KrF excimer laser apparatus and the ArF excimer laser apparatus have a large spectral line width of about 350 to 400 pm in natural oscillation. Thus, chromatic aberration of a laser beam (ultraviolet light), which is reduced and projected on a wafer by a projection lens of an exposure apparatus, occurs to reduce resolution. Then, a spectral line width of a laser beam output from the gas laser apparatus needs to be narrowed to the extent that the chromatic aberration can be ignored. The spectral line width is also referred to as a spectral width. For this purpose, a line narrowing module including a line narrowing element is provided in an optical resonator of the gas laser apparatus. The line narrowing module narrows the spectral width. The line narrowing element is an etalon, a grating, or the like. A laser apparatus with such a narrowed spectral width is referred to as a line narrowing laser apparatus.

LIST OF DOCUMENTS

Patent Documents

Patent Document 1: Japanese Patent Laid-Open No. 2016-139135
Patent Document 2: Japanese Translation of PCT International Application Publication No. 2008-522439
Patent Document 3: Japanese Patent Laid-Open No. 3-245583

SUMMARY

A laser apparatus according to one aspect of the present disclosure includes (A) an output coupling mirror; (B) a grating that constitutes an optical resonator together with the output coupling mirror; (C) a laser chamber arranged in an optical path of the optical resonator; (D) at least one prism arranged in an optical path between the laser chamber and the grating; (E) a rotary stage including an actuator configured to rotate the prism to change an incident angle of a laser beam output from the laser chamber on the grating; (F) a wavelength measuring unit configured to measure a central wavelength of the laser beam output from the laser chamber through the output coupling mirror; (G) an angle sensor configured to detect a rotation angle of the prism; (H) a first control unit configured to control the actuator at a first operation frequency based on a target wavelength input from an external device and a measured wavelength measured by the wavelength measuring unit; and (I) a second control unit configured to control the actuator at a second operation frequency equal to or higher than the first operation frequency based on the target wavelength and a detected angle detected by the angle sensor.

A laser apparatus according to one aspect of the present disclosure includes (A) an output coupling mirror; (B) a grating that constitutes an optical resonator together with the output coupling mirror; (C) a laser chamber arranged in an optical path of the optical resonator; (D) at least one prism arranged in an optical path between the laser chamber and the grating; (E) a rotary stage including an actuator configured to rotate the prism to change an incident angle of a laser beam output from the laser chamber on the grating; (F) a wavelength measuring unit configured to measure a central wavelength of the laser beam output from the laser chamber through the output coupling mirror; (G) an angle sensor configured to detect a rotation angle of the prism; and (H) a control unit configured to correct a relationship between a detected angle detected by the angle sensor and a wavelength based on a measured wavelength measured by the wavelength measuring unit, to convert the detected angle into a wavelength based on the corrected relationship, and to perform feedback control of the actuator based on a difference between the converted wavelength and a target wavelength input from an external device.

An electronic device manufacturing method according to one aspect of the present disclosure includes generating a pulse laser beam with a laser apparatus; outputting the pulse laser beam to an exposure apparatus; and exposing the pulse laser beam onto a photosensitive substrate within the exposure apparatus to manufacture an electronic device, the laser apparatus including (A) an output coupling mirror, (B) a grating that constitutes an optical resonator together with the output coupling mirror, (C) a laser chamber arranged in an optical path of the optical resonator, (D) at least one prism arranged in an optical path between the laser chamber and the grating, (E) a rotary stage including an actuator configured to rotate the prism to change an incident angle of a laser beam output from the laser chamber on the grating, (F) a wavelength measuring unit configured to measure a central wavelength of the laser beam output from the laser chamber through the output coupling mirror, (G) an angle sensor configured to detect a rotation angle of the prism, (H) a first control unit configured to control the actuator at a first operation frequency based on a target wavelength input from an external device and a measured wavelength measured by the wavelength measuring unit, and (I) a second control unit configured to control the actuator at a second operation frequency equal to or higher than the first operation frequency based on the target wavelength and a detected angle detected by the angle sensor.

BRIEF DESCRIPTION OF THE DRAWINGS

With reference to the accompanying drawings, some embodiments of the present disclosure will be described below merely by way of example.

DESCRIPTION OF EMBODIMENTS

Figure 1:
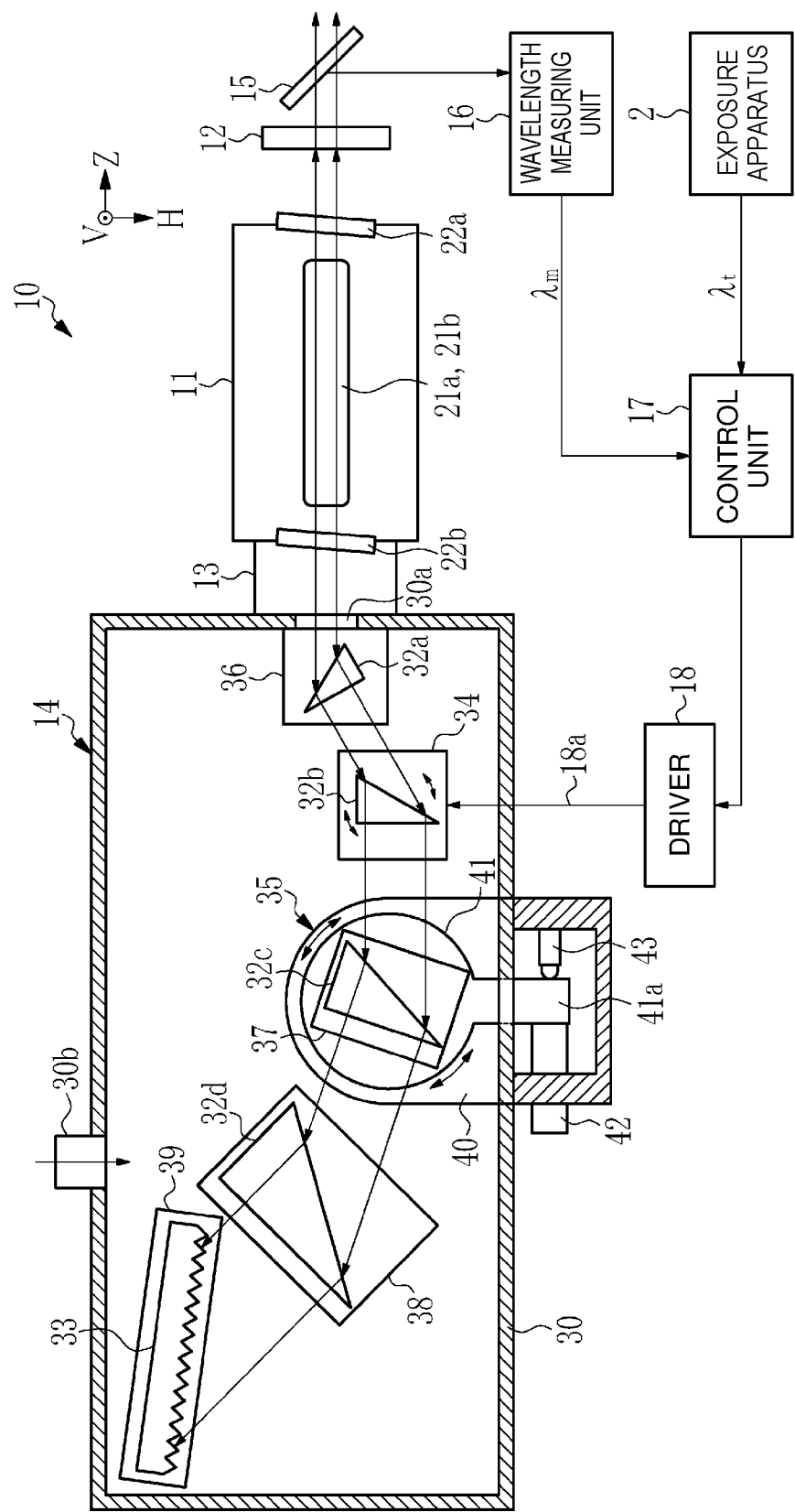
FIG. 1 is a top view of a laser apparatus according to a comparative example viewed in a V direction.

<Contents>
1. Comparative example
　1.1 Configuration
　1.2 Operation
　1.3 Configuration and operation of control unit
　1.4 Problem
2. First Embodiment
　2.1 Configuration
　　2.1.1 Overall configuration
　　2.1.2 Configuration of control unit
　2.2 Operation
　2.3 Effect
3. Second Embodiment
　3.1 Configuration and operation
4. Third Embodiment
　4.1 Configuration and operation
　4.2 Variant
5. Fourth Embodiment
　5.1 Configuration and operation
6. Fifth Embodiment
　6.1 Configuration
　6.2 Operation
　6.3 Effect
7. Others Now, with reference to the drawings, embodiments of the present disclosure will be described in detail. The embodiments described below illustrate some examples of the present disclosure, and do not limit contents of the present disclosure. Also, all configurations and operations described in the embodiments are not necessarily essential as configurations and operations of the present disclosure. The same components are denoted by the same reference characters, and overlapping descriptions are omitted.

1. Comparative Example

Now, a laser apparatus according to a comparative example will be described. The laser apparatus according to the comparative example is a line narrowing excimer laser apparatus.

1.1 Configuration

Figure 2:
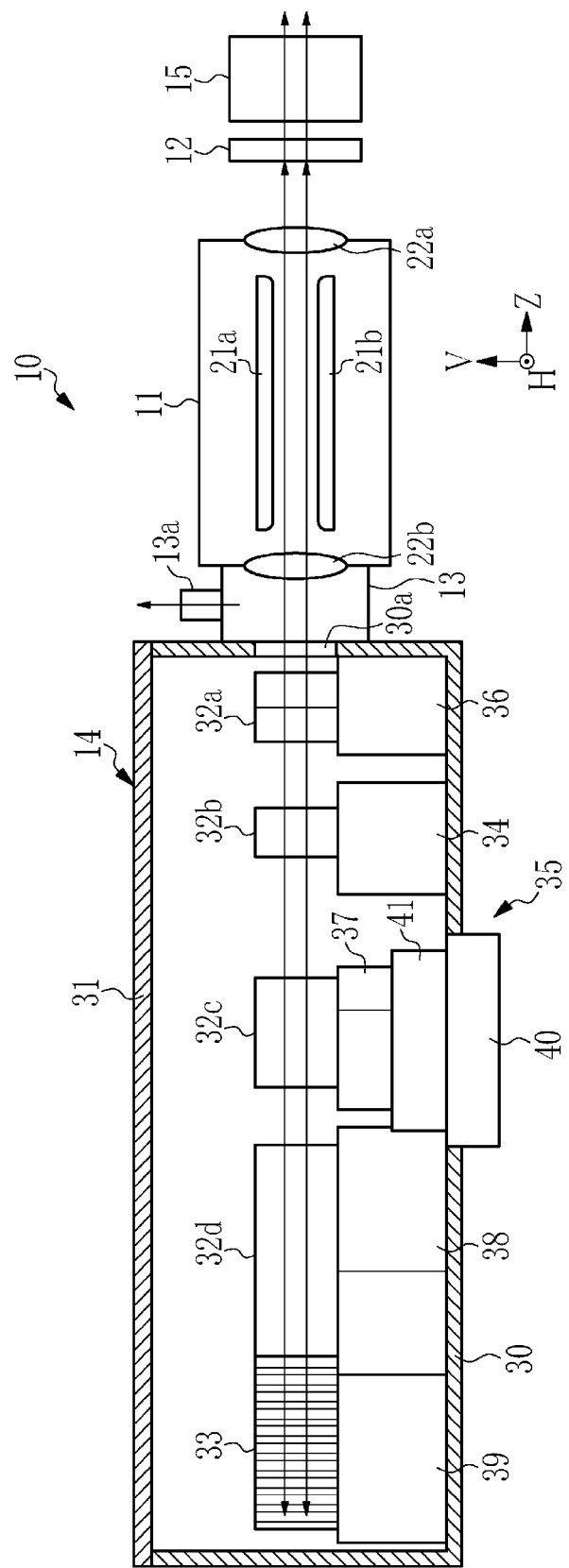
FIG. 2 is a side view of the laser apparatus according to the comparative example viewed in an H direction.

FIGS. 1 and 2 schematically show a configuration of a laser apparatus 10 according to the comparative example of the present disclosure. FIG. 1 is a top view of the laser apparatus 10 viewed in a V direction. FIG. 2 is a side view of the laser apparatus 10 viewed in an H direction. A Z direction is an output direction of a laser beam from the laser apparatus 10. The V direction and the H direction are each orthogonal to the Z direction. The V direction and the H direction are orthogonal to each other.

The laser apparatus 10 includes a laser chamber 11, an output coupling mirror 12, an optical path tube 13, a line narrowing module 14, a beam splitter 15, a wavelength measuring unit 16, a control unit 17, and a driver 18. The output coupling mirror 12 and a grating 33 (described later) included in the line narrowing module 14 constitute an optical resonator. The laser chamber 11 is arranged in an optical path of the optical resonator.

In the laser chamber 11, a first electrode 21a, a second electrode 21b, a first window 22a, and a second window 22b are arranged. The first electrode 21a and the second electrode 21b are arranged such that a longitudinal direction thereof matches the Z direction that is an optical path direction of the optical resonator. The first electrode 21a and the second electrode 21b face each other in the H direction. The first electrode 21a and the second electrode 21b are connected to a power source (not shown). A space between the first electrode 21a and the second electrode 21b is hereinafter referred to as a discharge space.

The laser chamber 11 is filled with a laser gas containing an Ar gas or a Kr gas as a rare gas, an $F_2$ gas as a halogen gas, and an Ne gas as a buffer gas. The laser gas is excited by discharge that occurs in the discharge space to generate a laser beam. The first window 22a and the second window 22b are arranged to face each other in the Z direction such that the laser beam generated by discharge excitation in the discharge space and amplified passes therethrough. The first window 22a and the second window 22b are arranged such that their entrance planes include the H direction and the laser beam enters the first window 22a and the second window 22b at an angle close to a Brewster's angle.

The line narrowing module 14 includes a casing 30, a lid 31, prisms 32a to 32d, a grating 33, a fine adjustment rotary stage 34, a coarse adjustment rotary stage 35, and holders 36 to 39. The casing 30 of the line narrowing module 14 is connected through the optical path tube 13 to the laser chamber 11. The optical path tube 13 is connected to the laser chamber 11 to cover the second window 22b.

The casing 30 has a through-hole 30a. The interior of the casing 30 communicates with the optical path tube 13 through the through-hole 30a. The casing 30 houses therein the prisms 32a to 32d, the grating 33, the fine adjustment rotary stage 34, the coarse adjustment rotary stage 35, the holders 36 to 39, and the like. The lid 31 is connected to an opening provided at top of the casing 30.

A gas inlet tube 30b is connected to the casing 30. A gas outlet tube 13a is connected to the optical path tube 13. A purge gas is introduced through the gas inlet tube 30b into the casing 30. The purge gas introduced into the casing 30 flows through the through-hole 30a into the optical path tube 13 and is discharged through the gas outlet tube 13a to the outside. The purge gas is an inert gas such as a high purity nitrogen gas or an He gas.

The prisms 32a to 32d are arranged in an optical path between the laser chamber 11 and the grating 33. The prisms 32a to 32d serve as beam expanders that expand a beam diameter of the laser beam in an HZ plane. The prism 32a is held by the holder 36 and is fixedly arranged. The prism 32b is held by the fine adjustment rotary stage 34 including an actuator (described later). The prism 32c is held by the holder 37 included in the coarse adjustment rotary stage 35. The prism 32d is held by the holder 38 and is fixedly arranged.

The prism 32b corresponds to a first prism in claims. The prism 32c corresponds to a second prism in claims.

The prisms 32a to 32d are each made of calcium fluoride ($CaF_2$) crystals. Inclined surfaces of the prisms 32a to 32d are coated with reflection reducing films (not shown) for a P-polarized laser beam, and vertical surfaces are coated with reflection reducing films.

The grating 33 is arranged in a Littrow configuration such that a wavelength dispersion surface substantially matches the HZ plane and that an incident angle of the laser beam substantially matches a diffracting angle thereof. The grating 33 is held by the holder 39 and is fixedly arranged. The grating 33 diffracts the incident laser beam to narrow a wavelength. The grating 33 may be an echelle grating blazed for a wavelength of about 193.4 nm.

The fine adjustment rotary stage 34 is a piezo stage that allows fine angle adjustment with a piezo actuator. The prism 32b is placed on the fine adjustment rotary stage 34 and is rotated around an axis parallel to the V direction. Rotation of the fine adjustment rotary stage 34 is controlled by the driver 18 through a signal line 18a. The signal line 18a is connected to the actuator of the fine adjustment rotary stage 34.

The coarse adjustment rotary stage 35 includes a stationary plate 40, a rotary plate 41, a linear stepping motor 42, a plunger screw 43, and the holder 37. The stationary plate 40 is secured to the casing 30. The holder 37 holds the prism 32c and is arranged on the rotary plate 41. The rotary plate 41 is rotatably arranged on the stationary plate 40. The rotary plate 41 has a lever 41a.

The plunger screw 43 is provided in a position against which the lever 41a abuts. The linear stepping motor 42 is provided to face the plunger screw 43 via the lever 41a. The linear stepping motor 42 presses the lever 41a to rotate the rotary plate 41. The prism 32c rotates, together with the rotary plate 41, around an axis parallel to the V direction. Operation of the linear stepping motor 42 is controlled by a control unit (not shown).

The fine adjustment rotary stage 34 rotatably holds the prism 32b. The fine adjustment rotary stage 34 serves as a first wavelength selecting mechanism that rotates the prism 32b to change an incident angle of the laser beam on the grating 33 and to select a central wavelength of the laser beam. The coarse adjustment rotary stage 35 serves as a second wavelength selecting mechanism that rotates the prism 32c to change an incident angle of the laser beam on the grating 33 and to select a central wavelength of the laser beam. The fine adjustment rotary stage 34 allows selection of the central wavelength within a wavelength range of several pm. The coarse adjustment rotary stage 35 allows selection of the central wavelength within a wavelength range of several nm.

The beam splitter 15 is arranged to reflect part of the laser beam output from the laser chamber 11 through the output coupling mirror 12 and to cause the reflected beam to enter the wavelength measuring unit 16. The laser beam having passed through the beam splitter 15 is supplied to an exposure apparatus 2 as an external device. The wavelength measuring unit 16 is a spectrometer such as a monitor etalon and is configured to detect an interference pattern generated by the etalon with an image sensor. The wavelength measuring unit 16 measures the central wavelength of the laser beam and transmits a signal indicating a measured wavelength $\lambda_m$ to the control unit 17.

The control unit 17 receives a signal indicating a target wavelength $\lambda_t$ from the exposure apparatus 2. The control unit 17 is configured to drive the driver 18 based on a difference between the measured wavelength $\lambda_m$ and the target wavelength λt and to control a rotation angle of the fine adjustment rotary stage 34.

1.2 Operation

Now, operation of the laser apparatus 10 will be described. When a high voltage is applied between the first electrode 21a and the second electrode 21b in the laser chamber 11, discharge occurs in the discharge space to excite the laser gas to generate a laser beam. The laser beam generated in the laser chamber 11 enters the line narrowing module 14 through the optical path tube 13.

The laser beam having entered the line narrowing module 14 is expanded in beam diameter in the HZ plane by the prisms 32a to 32d and enters the grating 33. The grating 33 performs wavelength selection. Specifically, the laser beam having entered the grating 33 is diffracted and dispersed, and a beam having substantially the same optical path axis as the incident beam passes through the prisms 32a to 32d and is output from the line narrowing module 14, and thus the wavelength selection is performed to narrow the wavelength.

The laser beam output from the line narrowing module 14 again enters the laser chamber 11 through the optical path tube 13, passes through the discharge space, and is thus amplified. The laser beam having passed through the first window 22a from the laser chamber 11 enters the output coupling mirror 12. One part of the laser beam having entered the output coupling mirror 12 passes through the output coupling mirror 12, and the other part is reflected by the output coupling mirror 12. The laser beam reflected by the output coupling mirror 12 enters the laser chamber 11 through the first window 22a, passes through the discharge space, and is thus amplified. The above operation is repeated to cause laser oscillation.

The laser beam output from the output coupling mirror 12 is a line-narrowed laser beam. One part of the laser beam output from the output coupling mirror 12 is reflected by the beam splitter 15 and enters the wavelength measuring unit 16. The laser beam having passed through the beam splitter 15 is supplied to the exposure apparatus 2. The control unit 17 receives a signal indicating a measured wavelength $\lambda_m$ from the wavelength measuring unit 16. The control unit 17 receives a signal indicating a target wavelength $\lambda_t$ from the exposure apparatus 2. The control unit 17 calculates a difference $\Delta\lambda$ between the measured wavelength $\lambda_t$ and the target wavelength $\lambda_t$, and controls the actuator of the fine adjustment rotary stage 34 with the driver 18 such that $\Delta\lambda$ approaches 0. As a result, the central wavelength of the laser beam output from the laser apparatus 10 is close to the target wavelength $\lambda_t$.

The discharge in the laser chamber 11 occurs at a predetermined cycle, and a pulsed laser beam is supplied from the laser apparatus 10 to the exposure apparatus 2 at a predetermined cycle. A period in which the pulsed laser beam is repeatedly supplied from the laser apparatus 10 to the exposure apparatus 2 is hereinafter referred to as a burst oscillation period. In the burst oscillation period, the exposure apparatus 2 performs exposure of one exposure area on a semiconductor wafer. The exposure apparatus 2 transmits, as appropriate, the target wavelength $\lambda_t$ to the control unit 17 in the laser apparatus 10 within the burst oscillation period.

The coarse adjustment rotary stage 35 is not driven but is stationary within the burst oscillation period. The coarse adjustment rotary stage 35 is driven outside the burst oscillation period when the semiconductor wafer is replaced in the exposure apparatus 2 or when atmospheric pressure varies.

1.3 Configuration and Operation of Control Unit

Figure 3:
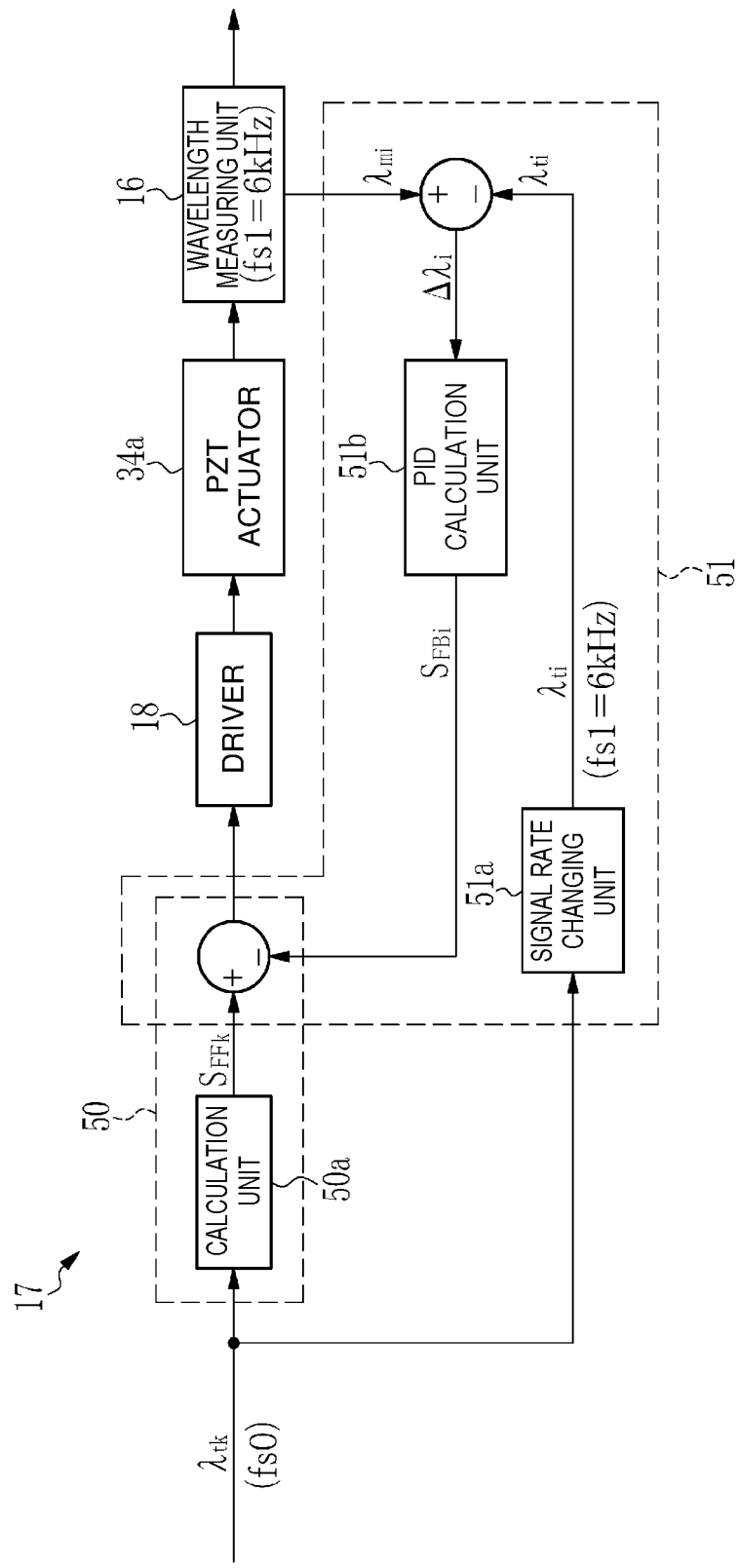
FIG. 3 is a block diagram of a configuration of a control unit.

Next, details of a configuration and operation of the control unit 17 will be described. FIG. 3 is a block diagram of the configuration of the control unit 17. The control unit 17 includes a feedforward unit 50 and a feedback unit 51. Hereinafter, feedforward is abbreviated as FF and feedback is abbreviated as FB.

The exposure apparatus 2 inputs, to the control unit 17, a signal indicating a target wavelength $\lambda_t$ at a sampling rate (signal rate) fs0. The target wavelength $\lambda_t$ indicated by the signal at the sampling rate fs0 is referred to as a target wavelength $\lambda_{tk}$, where k is a sampling index and is expressed by 1, 2, 3, . . . L.

The FF unit 50 includes a calculation unit 50a. The calculation unit 50a generates a control signal $S_{FFk}$ corresponding to the target wavelength $\lambda_{tk}$ input from the exposure apparatus 2. The control signal $S_{FFk}$ is input to the driver 18. The driver 18 generates an applied voltage based on the control signal $S_{FFk}$, and applies the generated applied voltage to a lead zirconate titanate (PZT) actuator 34a. The PZT actuator 34a is the actuator included in the fine adjustment rotary stage 34. The PZT actuator 34a is deformed according to the applied voltage to rotate the prism 32b to an angle corresponding to the target wavelength $\lambda_{tk}$. The wavelength measuring unit 16 measures a central wavelength of the laser beam, for example, at a sampling rate fs1 of 6 kHz, and transmits a signal indicating a measured wavelength $\lambda_{mi}$ to the FB unit 51, where i is a sampling index and is expressed by 1, 2, 3, . . . N. The sampling rate fs1 corresponds to a first operation frequency in claims.

The FB unit 51 includes a signal rate changing unit 51a and a proportional-integral-differential (PID) calculation unit 51b. The signal rate changing unit 51a is constituted by a D/A converter and an A/D converter, and changes the sampling rate fs0 of the signal indicating the target wavelength $\lambda_t$ to be equal to the sampling rate fs1 of the wavelength measuring unit 16. When fs0 is lower than fs1, the signal rate changing unit 51a upsamples the signal at the sampling rate fs0 to generate a signal at the sampling rate fs1. Specifically, the signal rate changing unit 51a generates a target wavelength $\lambda_{ti}$ indicated by the signal at the sampling rate fs1. The PID calculation unit 51b performs PID calculation at the same operation frequency as the sampling rate fs1 based on a difference $\Delta\lambda_i$ between the measured wavelength $\lambda_{mi}$ and the target wavelength $\lambda_{ti}$. The PID calculation unit 51b generates an FB signal $S_{FBi}$ and feeds back the FB signal $S_{FBi}$ to the driver 18. A voltage obtained by adding a corrected voltage based on the FB signal $S_{FBi}$ to the applied voltage based on the control signal $S_{FFk}$ is applied to the PZT actuator 34a.

With the above configuration, based on the control signal $S_{FFk}$ generated by the FF unit 50, the applied voltage corresponding to the target wavelength input from the exposure apparatus 2 is directly applied to the PZT actuator 34a. Thus, the PZT actuator 34a can be operated at high speed by frequency characteristics of a transfer function of the PZT actuator 34a. Also, the FB unit 51 corrects the applied voltage, which can suppress wavelength variation due to disturbance or the like.

Figure 4:
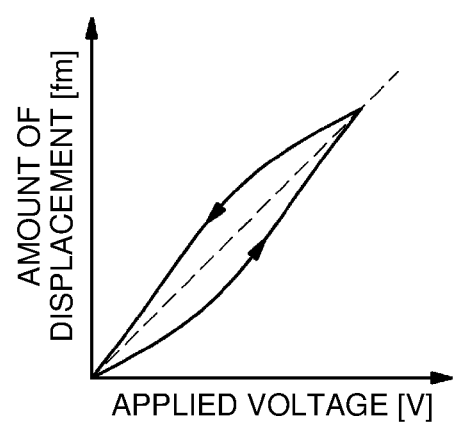
FIG. 4 is a graph illustrating hysteresis characteristics of a PZT actuator.

As shown in FIG. 4, a relationship between the applied voltage and an amount of displacement of the PZT actuator 34a is not exactly proportional but shows hysteresis characteristics. Thus, sensitivity K (fm/V) of the PZT actuator 34a indicating a ratio of the amount of displacement to the applied voltage varies depending on history of the applied voltage to the PZT actuator 34a. Such sensitivity variation is hereinafter referred to as sensitivity deviation. With the above configuration, the FB unit 51 can also suppress wavelength variation caused by the sensitivity deviation of the PZT actuator 34a.

1.4 Problem

Figure 5:
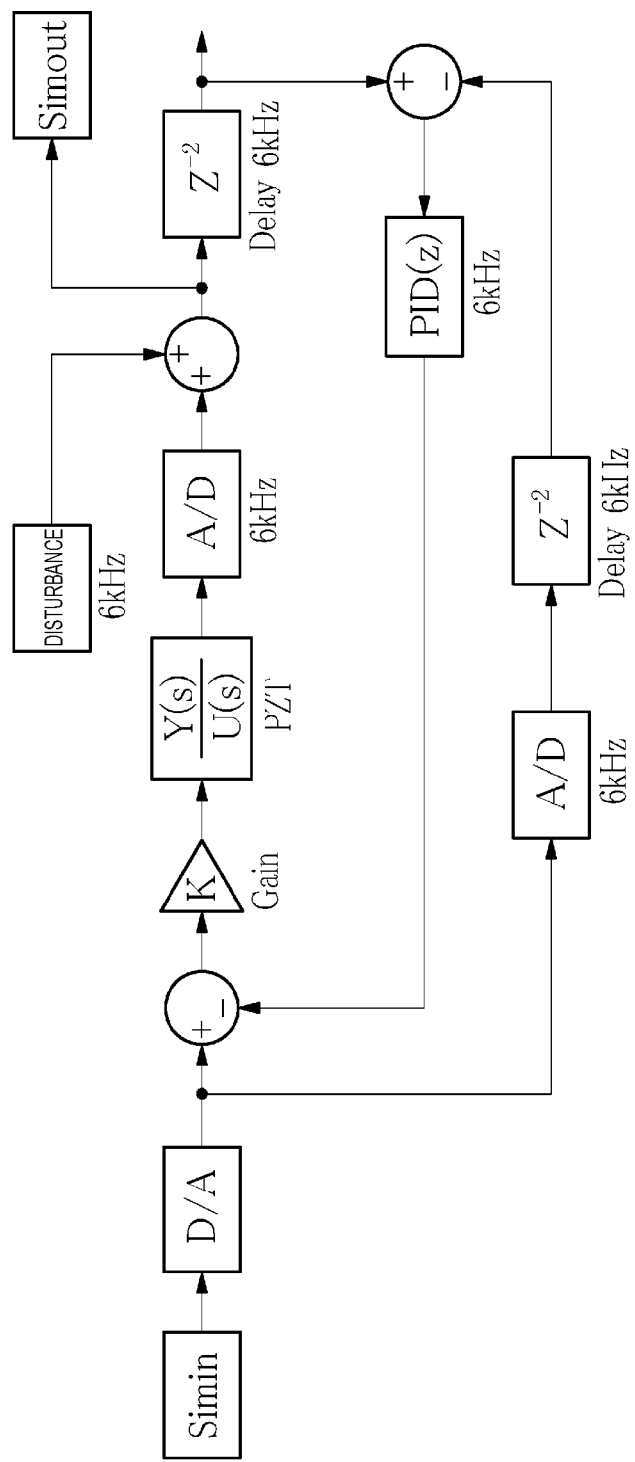
FIG. 5 is a simulation block diagram corresponding to the laser apparatus according to the comparative example.

Next, problems of the laser apparatus 10 according to the comparative example will be described. There may be a case that the target wavelength $\lambda_{tk}$ input from the exposure apparatus 2 is changed at high speed during the burst oscillation period. The target wavelength $\lambda_{tk}$ is changed, for example, at a frequency of 1 kHz maximum. The inventors performed a simulation described below to evaluate frequency characteristics of high speed wavelength control. FIG. 5 is a simulation block diagram.

Figure 6A:
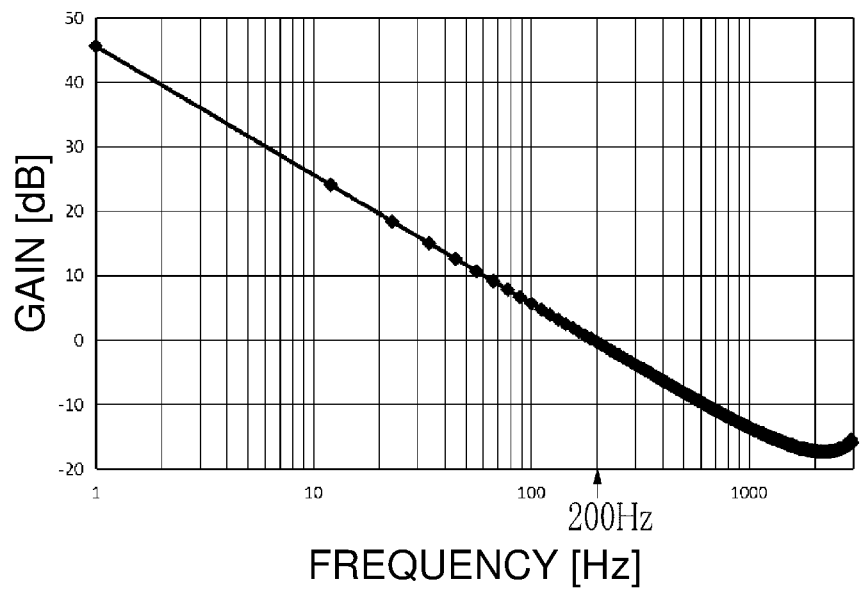
FIG. 6A is a graph showing an amount of change in gain of an output signal with respect to a frequency of an input signal.
Figure 6B:
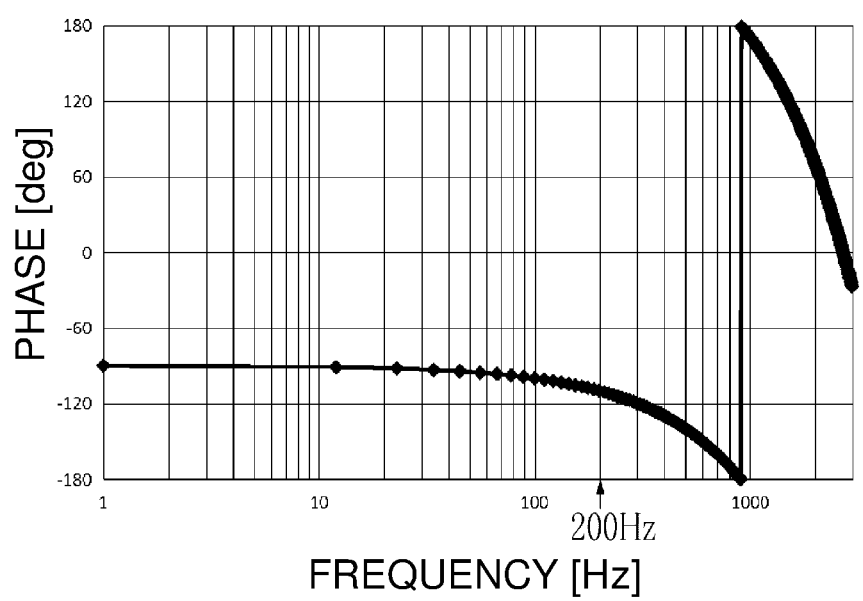
FIG. 6B is a graph showing an amount of change in phase of the output signal with respect to the frequency of the input signal.

FIGS. 6A and 6B show simulation results of a loop transfer function when a sinusoidal wave is input as an input signal Simin indicating the target wavelength $\lambda_{tk}$ in the simulation block diagram in FIG. 5. FIG. 6A is a graph showing an amount of change in gain of an output signal Simout with respect to a frequency of an input signal Simin, and FIG. 6B is a graph showing an amount of change in phase of the output signal Simout with respect to the frequency of the input signal Simin. FIGS. 6A and 6B reveal that a control block in FIG. 5 can only ensure a feedback control range up to 200 Hz.

Figure 7A:
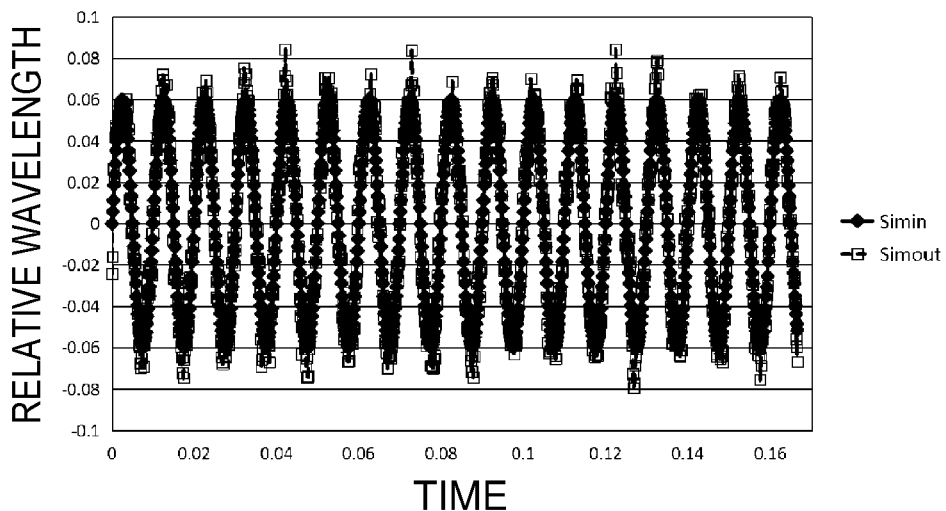
FIG. 7A is a graph showing an output signal when a sinusoidal wave of 100 Hz is input as an input signal to a control block.
Figure 7B:
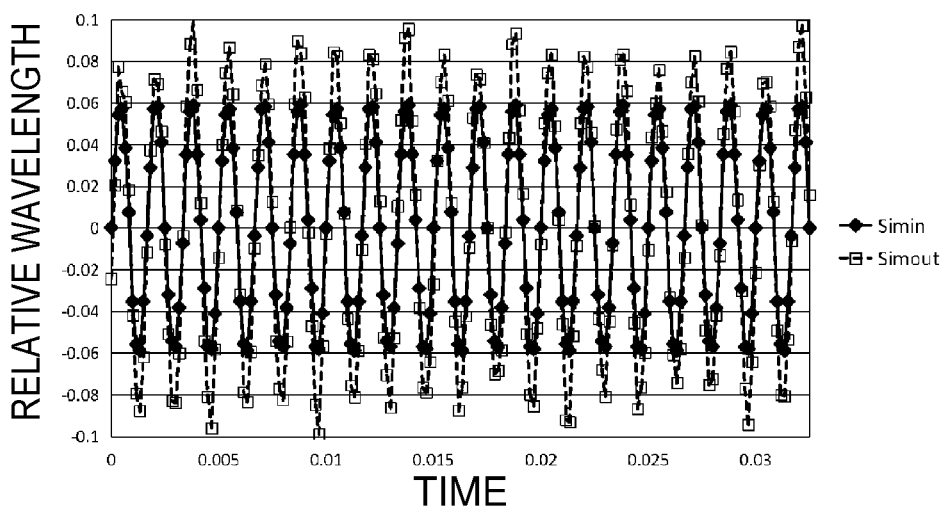
FIG. 7B is a graph showing an output signal when a sinusoidal wave of 600 Hz is input as an input signal to the control block.

FIG. 7A is a graph showing an output signal Simout when a sinusoidal wave of 100 Hz is input as an input signal Simin to the control block, and FIG. 7B is a graph showing an output signal Simout when a sinusoidal wave of 600 Hz is input as an input signal Simin to the control block. The output signal Simout indicates the measured wavelength $\lambda_{mi}$ of the central wavelength of the laser beam output from the laser apparatus 10. FIGS. 7A and 7B show results of a simulation performed by changing the sensitivity K based on the hysteresis characteristics of the PZT actuator 34a.

As a result, in the case where the sensitivity K is deviated from an assumed value, for example, 1, as shown in FIG. 7A, the output signal Simout follows the input signal Simin by feedback control at the frequency of 100 Hz of the input signal Simin. On the other hand, as shown in FIG. 7B, the output signal Simout cannot follow the input signal Simin by the feedback control at the frequency of 600 Hz of the input signal Simin. This increases a difference between the target wavelength and the measured wavelength, and reduces stability of the wavelength of the laser beam output from the laser apparatus 10.

As such, with the laser apparatus 10 according to the comparative example, it is difficult to control the wavelength of the laser beam with high accuracy with changes in the target wavelength when the target wavelength is changed at high speed.

Also, the laser apparatus 10 according to the comparative example is the pulse laser apparatus, and thus the wavelength measuring unit 16 can measure the central wavelength only at timing when the laser apparatus 10 outputs the laser beam. This prevents wavelength control at higher speed than a repetition frequency of the laser beam.

2. First Embodiment

Next, a laser apparatus 10a according to a first embodiment of the present disclosure will be described. Hereinafter, substantially the same components as those of the laser apparatus 10 according to the comparative example are denoted by the same reference characters, and descriptions thereof are omitted as appropriate.

2.1 Configuration
2.1.1 Overall configuration

Figure 8:
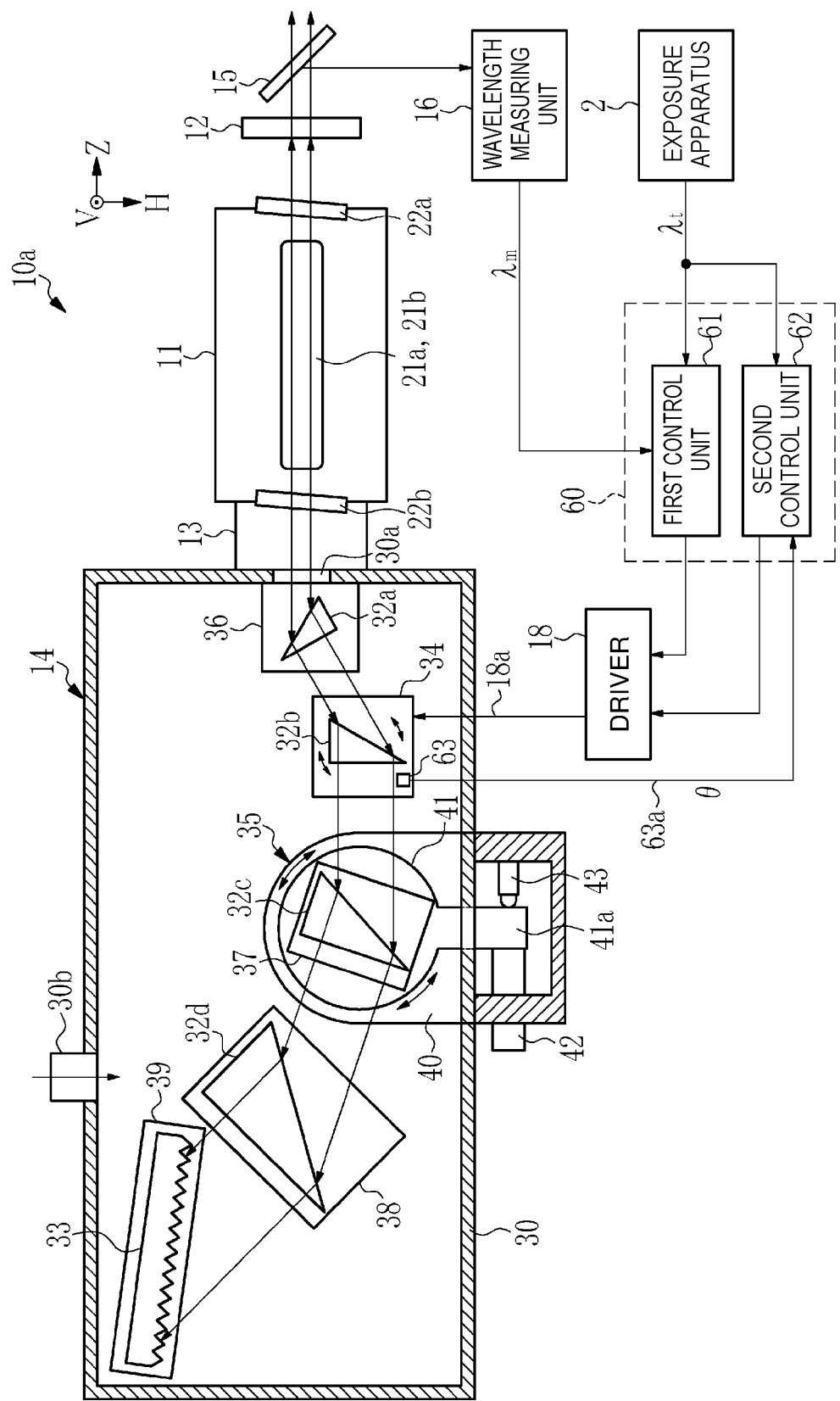
FIG. 8 is a top view of a laser apparatus according to a first embodiment viewed in a V direction.
Figure 9:
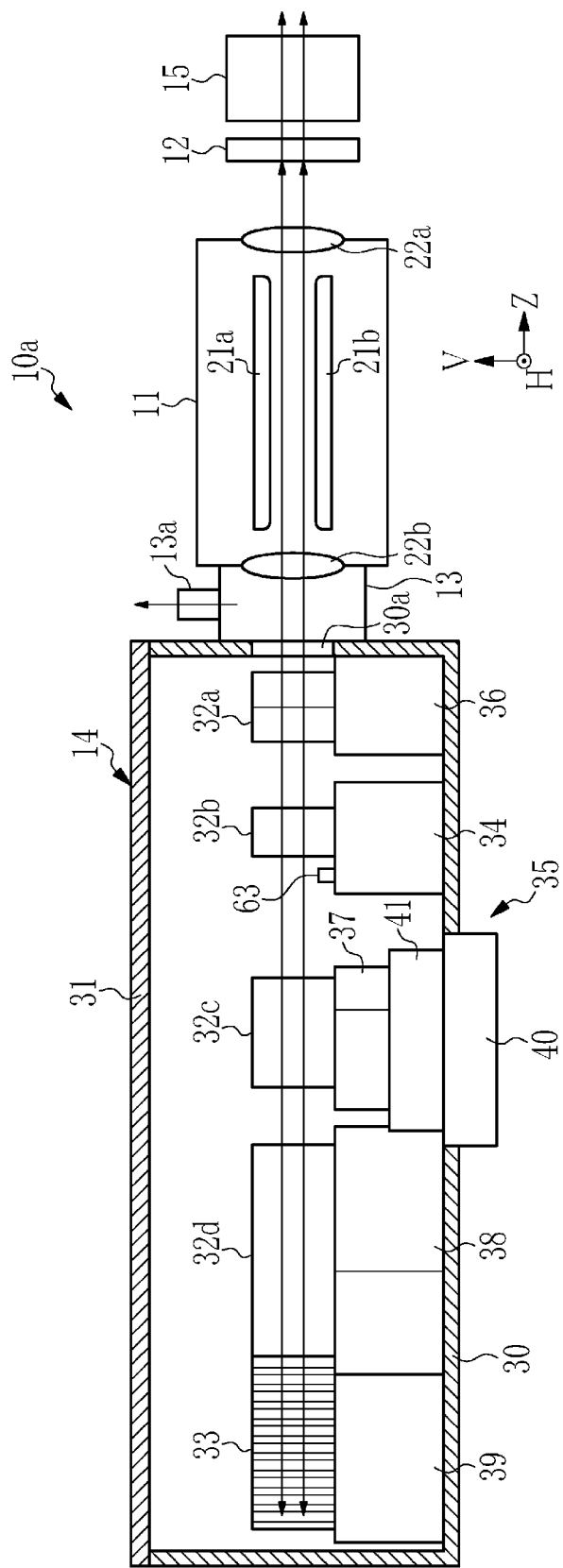
FIG. 9 is a side view of the laser apparatus according to the first embodiment viewed in an H direction.

FIGS. 8 and 9 schematically show a configuration of the laser apparatus 10a according to the first embodiment of the present disclosure. FIG. 8 is a top view of the laser apparatus 10a viewed in a V direction. FIG. 9 is a side view of the laser apparatus 10a viewed in an H direction.

The laser apparatus 10a according to the first embodiment includes an angle sensor 63 in addition to the components of the laser apparatus 10 according to the comparative example, and includes a control unit 60 in place of the control unit 17. The control unit 60 includes a first control unit 61 and a second control unit 62. The first control unit 61 has the same configuration as the control unit 17 in the comparative example.

The angle sensor 63 is fixedly provided on a non-rotating portion on a fine adjustment rotary stage 34, and detects an angle of one surface of a prism 32b as a rotation angle of the prism 32b. The angle sensor 63 transmits a signal indicating a detected angle θ through a signal line 63a connected to the angle sensor 63 to the second control unit 62. The second control unit 62 converts the detected angle θ received from the angle sensor 63 into a wavelength, and controls a PZT actuator 34a of the fine adjustment rotary stage 34 with a driver 18 such that a difference between the converted wavelength $\lambda_\theta$ and a target wavelength $\lambda_t$ approaches 0.

2.1.2 Configuration of Control Unit

Figure 10:
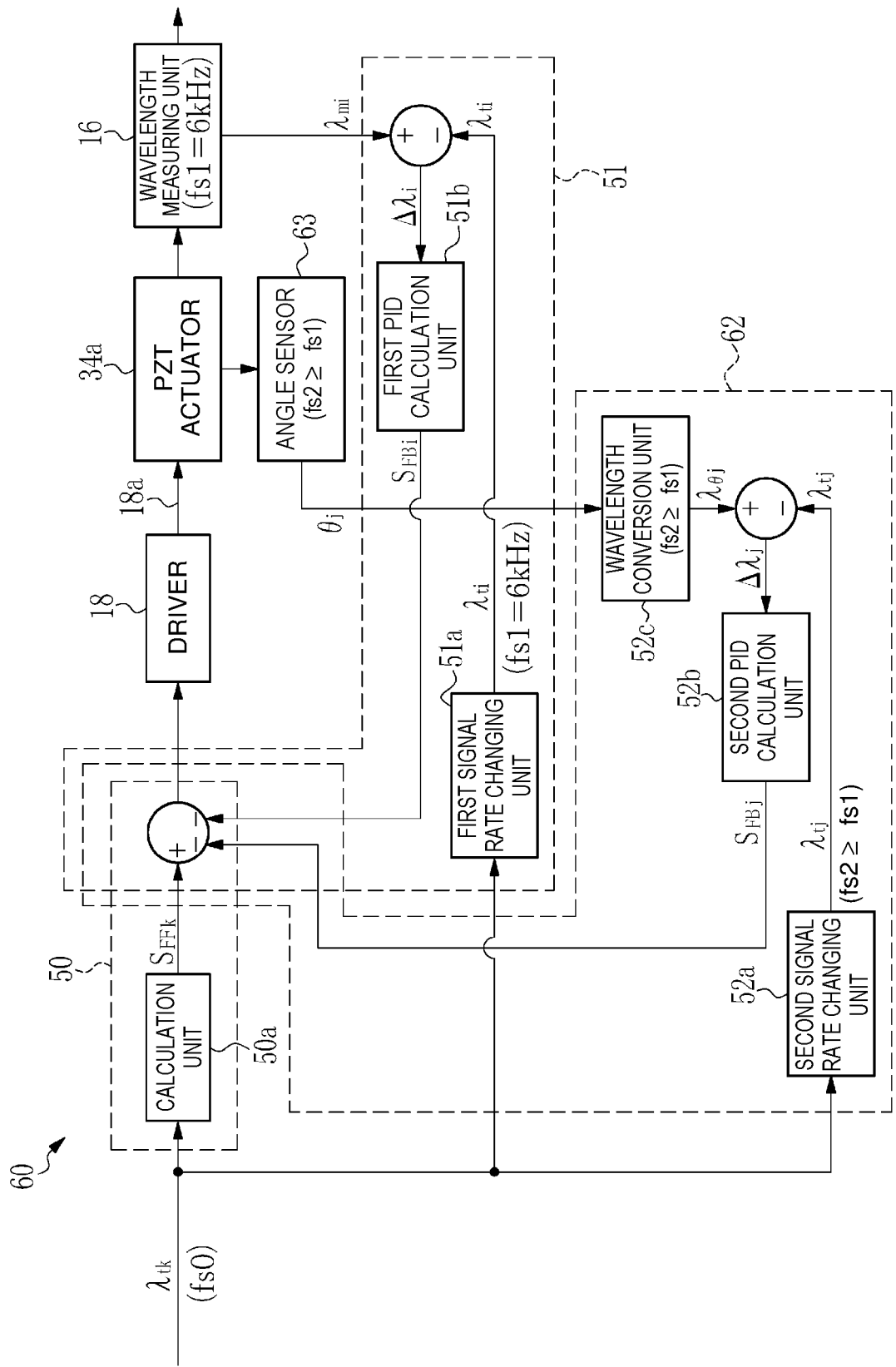
FIG. 10 is a block diagram of a configuration of a control unit.

FIG. 10 is a block diagram of a configuration of the control unit 60. The control unit 60 includes an FF unit 50 and an FB unit 51. The FF unit 50 has the same configuration as in the comparative example. The first FB unit 51 includes a first signal rate changing unit 51a and a first PID calculation unit 51b. The first FB unit 51, and the first signal rate changing unit 51a and the first PID calculation unit 51b included in the first FB unit 51 have the same configurations as the FB unit 51, and the signal rate changing unit 51a and the PID calculation unit 51b included in the FB unit 51 in the comparative example. The first PID calculation unit 51b performs PID calculation based on a difference $\Delta\lambda_i$ between a measured wavelength $\lambda_{mi}$ and a target wavelength $\lambda_{ti}$ to generate a first FB signal $S_{FBi}$ and feeds back the first FB signal $S_{FBi}$ to the driver 18.

The second control unit 62 includes a second signal rate changing unit 52a, a second PID calculation unit 52b, and a wavelength conversion unit 52c. The second signal rate changing unit 52a changes a sampling rate of a signal indicating a target wavelength $\lambda_{tk}$ to be equal to a sampling rate fs2 of the angle sensor 63. A target wavelength converted by the second signal rate changing unit 52a and indicated by the signal at the sampling rate fs2 is referred to as a target wavelength $\lambda_{tj}$, where j is a sampling index and is expressed by 1, 2, 3, . . . M. The sampling rate fs2 corresponds to a second operation frequency in claims.

The angle sensor 63 detects an angle of the prism 32b at the sampling rate fs2, and outputs a signal indicating a detected angle $\theta_j$. The sampling rate fs2 is equal to or higher than a sampling rate fs1 (fs2≥fs1).

The wavelength conversion unit 52c receives the signal indicating the detected angle $\theta_j$ from the angle sensor 63, and calculates a central wavelength $\lambda_{\theta j}$ of a laser beam based on the detected angle $\theta_j$. The wavelength conversion unit 52c operates in accordance with the sampling rate fs2. The second PID calculation unit 52b performs PID calculation at the same operation frequency as the sampling rate fs2. The second PID calculation unit 52b performs the PID calculation based on a difference $\Delta\lambda_j$ between the central wavelength $\lambda_{\theta j}$ calculated by the wavelength conversion unit 52c and the target wavelength $\lambda_{tj}$ to generate a second FB signal $S_{FBj}$ and feeds back the second FB signal SFB to the driver 18. A voltage obtained by adding a corrected voltage based on the first FB signal $S_{FBi}$ and a corrected voltage based on the second FB signal $S_{FBj}$ to an applied voltage based on a control signal $S_{FFk}$ are applied to the PZT actuator 34a.

The wavelength measuring unit 16 can measure the central wavelength only at timing when the laser apparatus 10a outputs the laser beam. The sampling rate fs1 of the wavelength measuring unit 16 is, for example, 6 kHz. On the other hand, the angle sensor 63 can detect the angle of the prism 32b even when the laser apparatus 10a does not output the laser beam. The sampling rate fs2 of the angle sensor 63 is preferably, for example, 6 kHz or higher.

2.2 Operation

Figure 11:
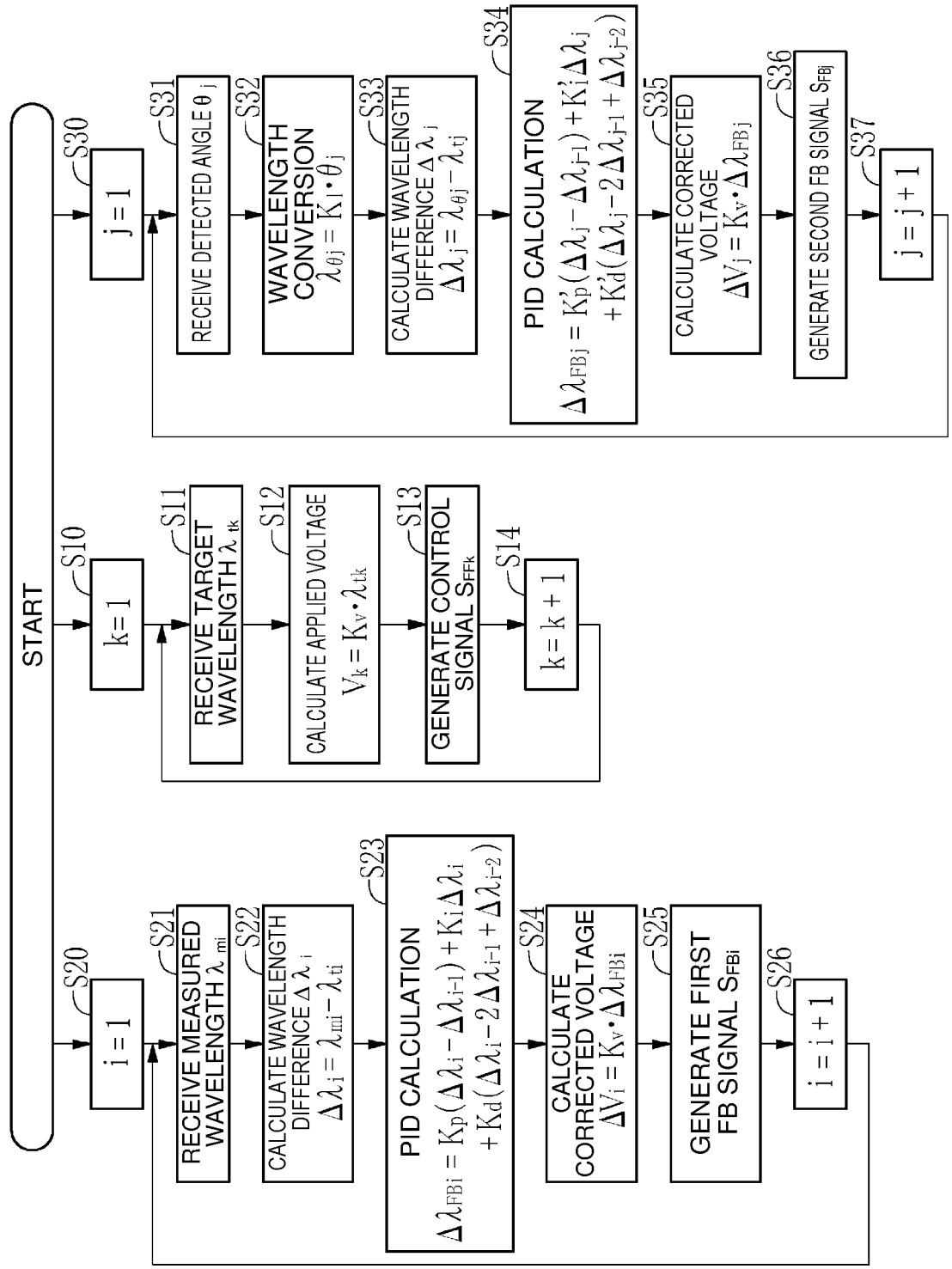
FIG. 11 is a flowchart of processing of control by the control unit.

The overall operation of the laser apparatus 10a is the same as that of the laser apparatus 10 according to the comparative example. Now, operation of the control unit 60 will be described. FIG. 11 is a flowchart of processing of control by the control unit 60. The control unit 60 concurrently performs FF control, first FB control, and second FB control. First, in FF control, the control unit 60 sets a parameter k to 1 (step S10), receives a signal indicating a target wavelength $\lambda_{tk}$ from an exposure apparatus 2 (step S11), and then calculates an applied voltage $V_k$ corresponding to the target wavelength $\lambda_{tk}$ with a calculation unit 50a (step S12). The applied voltage $V_k$ is calculated based on Expression (1) below.

$$V_k = K_v \cdot \lambda_{tk} \quad (1)$$

where $K_v$ is a constant and the unit is V/fm.

Then, the calculation unit 50a generates a control signal $S_{FFk}$ corresponding to the applied voltage $V_k$ (step S13). The control signal $S_{FFk}$ is input to the driver 18, and the driver 18 applies the applied voltage $V_k$ to the PZT actuator 34a. Then, the control unit 60 adds 1 to the parameter k (step S14), and returns the processing to step S11. The control unit 60 performs processes in steps S11 to S14 every time it receives a signal indicating the target wavelength $\lambda_{tk}$ at a sampling rate fs0.

In the first FB control, the first control unit 61 sets a parameter i to 1 (step S20), receives a signal indicating a measured wavelength $\lambda_{mi}$ from the wavelength measuring unit 16 (step S21), and then calculates a wavelength difference $\Delta\lambda_i$ between the measured wavelength $\lambda_{mi}$ and a target wavelength $\lambda_{ti}$ (step S22). The wavelength difference $\Delta\lambda_i$ is calculated based on Expression (2) below.

$$\Delta\lambda_i = \lambda_{mi} - \lambda_{ti} \quad (2)$$

Then, the first PID calculation unit 51b performs PID calculation based on Expression (3) below, and calculates a difference value $\Delta\lambda_{FBi}$ (step S23).

$$\Delta\lambda_{FBi} = K_p(\Delta\lambda_i - \Delta\lambda_{i-1}) + K_i \Delta\lambda_i + K_d(\Delta\lambda_i - 2\Delta\lambda_{i-1} + \Delta\lambda_{i-2}) \quad (3)$$

where $K_p$, $K_i$, and $K_d$ are predetermined constants.

Then, the first PID calculation unit 51b calculates a corrected voltage $\Delta V_i$ corresponding to the difference value $\Delta\lambda_{FBi}$ (step S24). The corrected voltage $\Delta V_i$ is calculated based on Expression (4) below.

$$\Delta V_i = K_v \cdot \Delta\lambda_{FBi} \quad (4)$$

Further, the first PID calculation unit 51b generates a first FB signal $S_{FBi}$ corresponding to the corrected voltage $\Delta V_i$ (step S25). The first FB signal $S_{FBi}$ is fed back to the driver 18, and the corrected voltage $\Delta V_i$ is added to the applied voltage from the driver 18 to the PZT actuator 34a. Then, the first control unit 61 adds 1 to the parameter i (step S26), and returns the processing to step S21. The first control unit 61 performs processes in steps S21 to S26 every time it receives signals indicating the measured wavelength $\lambda_{mi}$ and the target wavelength $\lambda_{ti}$ at the sampling rate fs1.

In the second FB control, the second control unit 62 sets a parameter j to 1 (step S30), receives a signal indicating a detected angle $\theta_j$ from the angle sensor 63 (step S31), and then calculates a central wavelength $\lambda_{\theta j}$ of the laser beam with the wavelength conversion unit 52c (step S32). Then, the second control unit 62 calculates a wavelength difference $\Delta\lambda_j$ between the calculated central wavelength $\lambda_{\theta j}$ and a target wavelength $\lambda_{tj}$ (step S33). The wavelength difference $\Delta\lambda_j$ is calculated based on Expression (5) below.

$$\Delta\lambda_j = \lambda_{\theta j} - \lambda_{tj} \quad (5)$$

Then, the second PID calculation unit 52b performs PID calculation based on Expression (6) below, and calculates a difference value $\Delta\lambda_{FBj}$ (step S34).

$$\Delta\lambda_{FBj} = K_p'(\Delta\lambda_j - \Delta\lambda_{j-1}) + K_i' \Delta\lambda_j + K_d'(\Delta\lambda_j - 2\Delta\lambda_{j-1} + \Delta\lambda_{j-2}) \quad (6)$$

where $K_p'$, $K_i'$, and $K_d'$ are predetermined constants.

Then, the second PID calculation unit 52b calculates a corrected voltage $\Delta V_j$ corresponding to the difference value $\Delta\lambda_{FBj}$ (step S35). The corrected voltage $\Delta V_j$ is calculated based on Expression (7) below.

$$\Delta V_j = K_v \cdot \Delta\lambda_{FBj} \quad (7)$$

Further, the second PID calculation unit 52b generates a second FB signal $S_{FBj}$ corresponding to the corrected voltage $\Delta V_j$ (step S36). The second FB signal $S_{FBj}$ is fed back to the driver 18, and the corrected voltage $\Delta V_j$ is added to the applied voltage from the driver 18 to the PZT actuator 34a. Then, the second control unit 62 adds 1 to the parameter j (step S37), and returns the processing to step S31. The second control unit 62 performs processes in steps S31 to S37 every time it receives signals indicating the central wavelength $\lambda_{\theta j}$ and the target wavelength $\lambda_{tj}$ at the sampling rate fs2.

2.3 Effect

With the laser apparatus 10a according to this embodiment, the applied voltage corresponding to the target wavelength input from the exposure apparatus 2 is directly applied to the PZT actuator 34a based on the control signal $S_{FFk}$ generated by the FF unit 50. Thus, the PZT actuator 34a can be operated at high speed by frequency characteristics of a transfer function of the PZT actuator 34a.

The first FB control with the first control unit 61 and the second FB control with the second control unit 62 correct the applied voltage, which can suppress wavelength variation due to disturbance or the like. The operation frequency of the first FB control depends on a repetition frequency of the laser beam, and is, for example, 6 kHz, and thus an FB range of only about 200 Hz can be ensured. However, in the laser apparatus 10a according to this embodiment, the operation frequency of the second FB control can be higher than the operation frequency of the first FB control, thereby sufficiently increasing the FB range.

Thus, in the laser apparatus 10a according to this embodiment, when the target wavelength is changed at high speed, the wavelength of the laser beam can be controlled with high accuracy with changes in the target wavelength. Also, a reduction in stability of the wavelength due to sensitivity deviation of the PZT actuator 34a can be suppressed.

3. Second Embodiment

Next, a laser apparatus 10b according to a second embodiment of the present disclosure will be described. Hereinafter, substantially the same components as those of the laser apparatus 10a according to the first embodiment are denoted by the same reference characters, and descriptions thereof are omitted as appropriate.

3.1 Configuration and Operation

Figure 12:
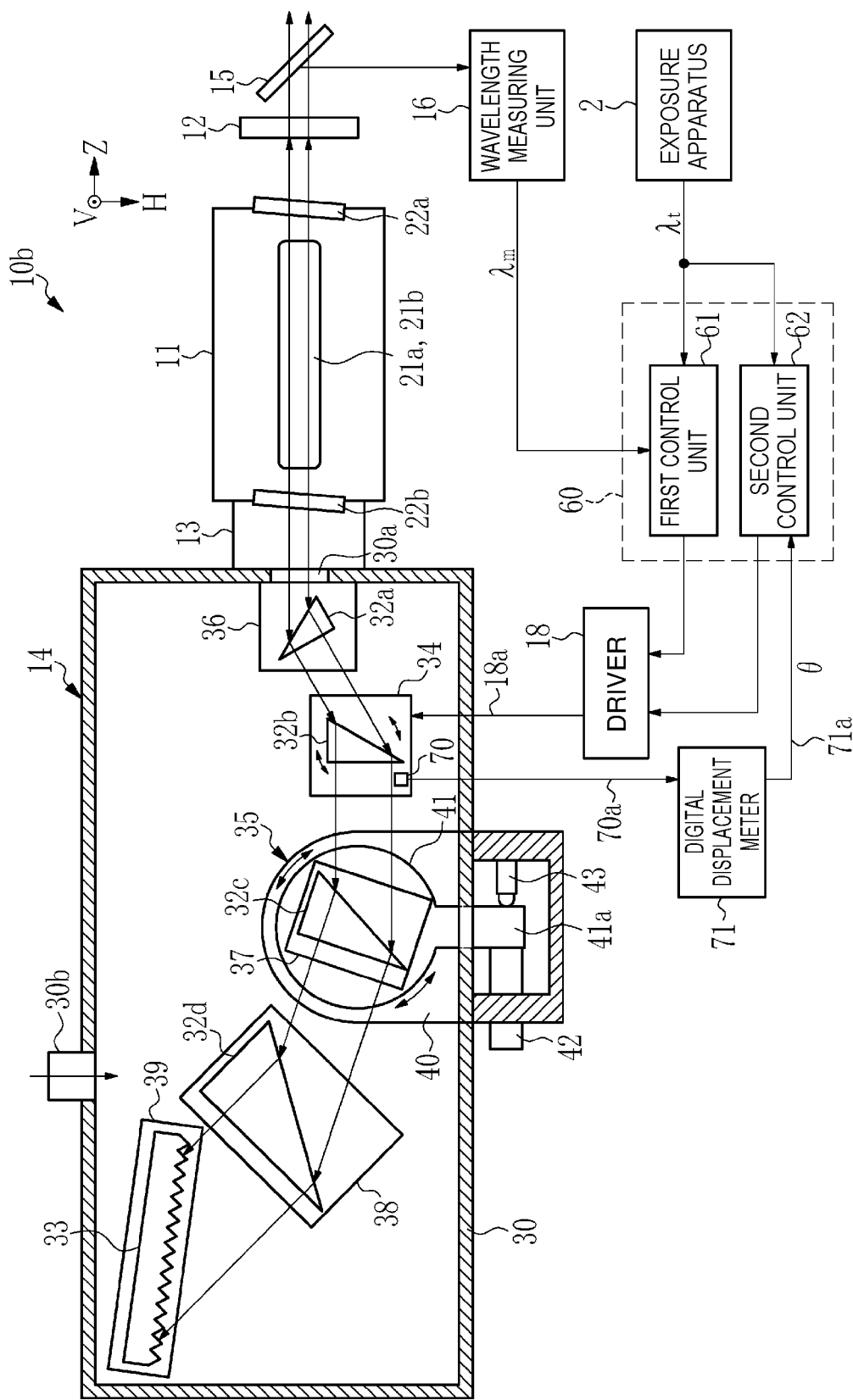
FIG. 12 is a top view of a laser apparatus according to a second embodiment viewed in the V direction.
Figure 13:
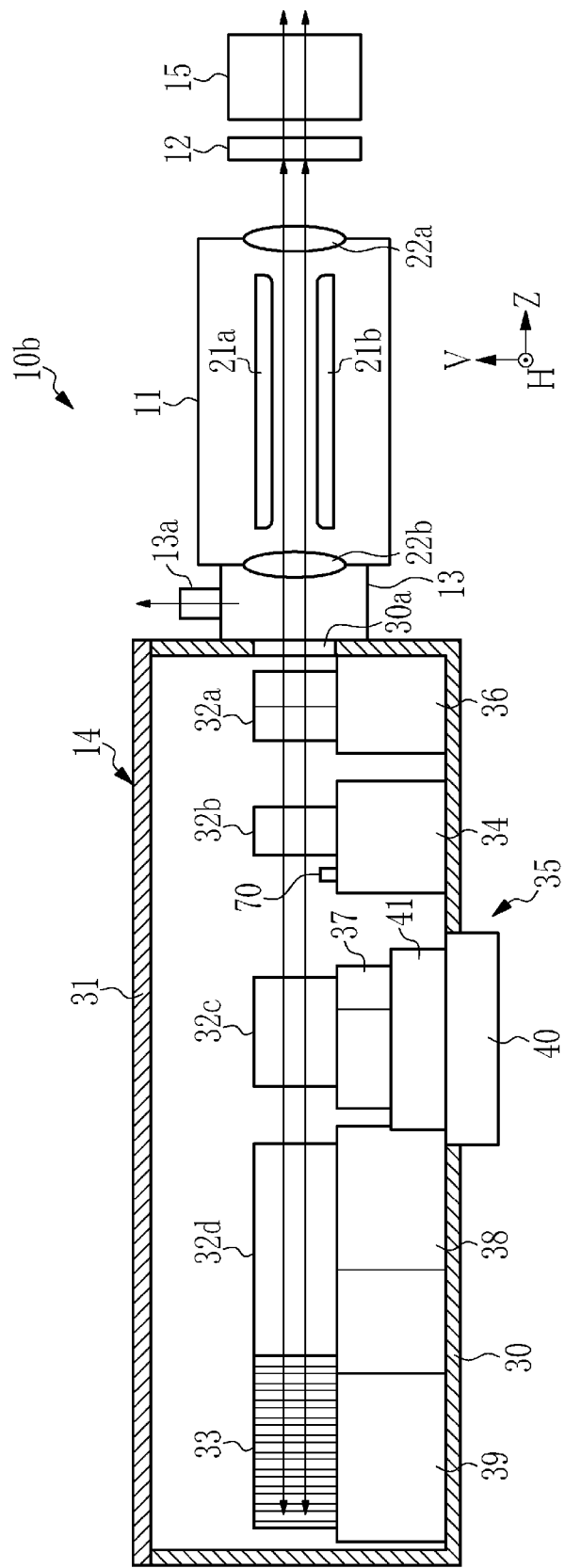
FIG. 13 is a side view of the laser apparatus according to the second embodiment viewed in the H direction.

FIGS. 12 and 13 schematically show a configuration of the laser apparatus 10b according to the second embodiment of the present disclosure. FIG. 12 is a top view of the laser apparatus 10b viewed in the V direction. FIG. 13 is a side view of the laser apparatus 10b viewed in the H direction.

In the laser apparatus 10b according to this embodiment, a laser Doppler vibration meter 70 constitutes an angle sensor. The laser Doppler vibration meter 70 is fixedly provided on a non-rotating portion on the fine adjustment rotary stage 34. The laser Doppler vibration meter 70 detects a speed of one surface of the prism 32b, and outputs a speed signal through a signal line 70a to a digital displacement meter 71.

The digital displacement meter 71 converts the speed signal output from the laser Doppler vibration meter 70 into a position signal indicating a position of one surface of the prism 32b. Specifically, the position signal corresponds to an angle θ of the prism 32b. The position signal output from the digital displacement meter 71 is input as a detected angle θ through a signal line 71a to the second control unit 62. The laser Doppler vibration meter 70 and the digital displacement meter 71 are operated at the sampling rate fs2.

Other configurations and operations of the laser apparatus 10b according to this embodiment are the same as those of the laser apparatus 10a according to the first embodiment, and thus descriptions thereof are omitted.

4. Third Embodiment

Next, a laser apparatus 10c according to a third embodiment of the present disclosure will be described. Hereinafter, substantially the same components as those of the laser apparatus 10a according to the first embodiment are denoted by the same reference characters, and descriptions thereof are omitted as appropriate.

4.1 Configuration and Operation

Figure 14:
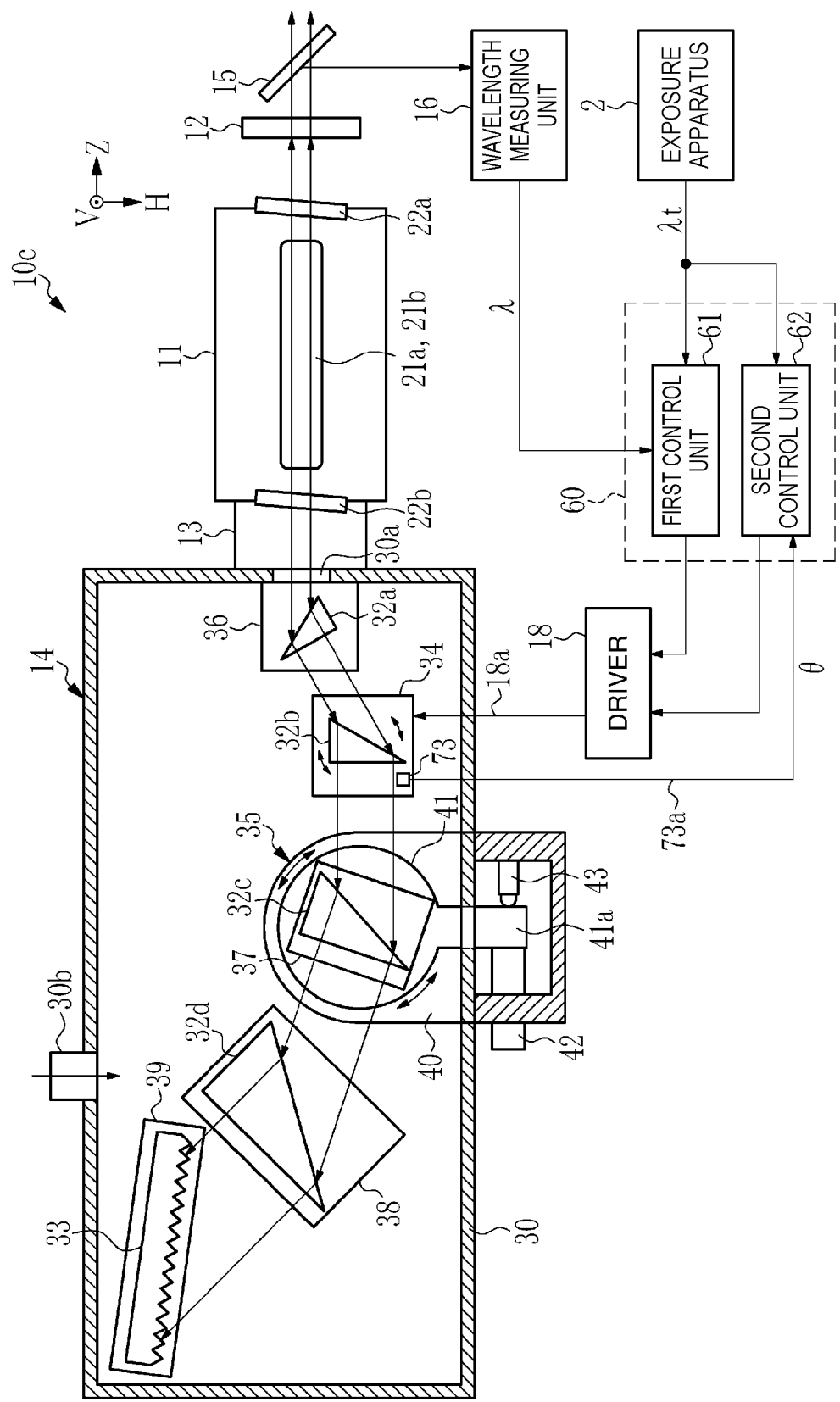
FIG. 14 is a top view of a laser apparatus according to a third embodiment viewed in the V direction.
Figure 15:
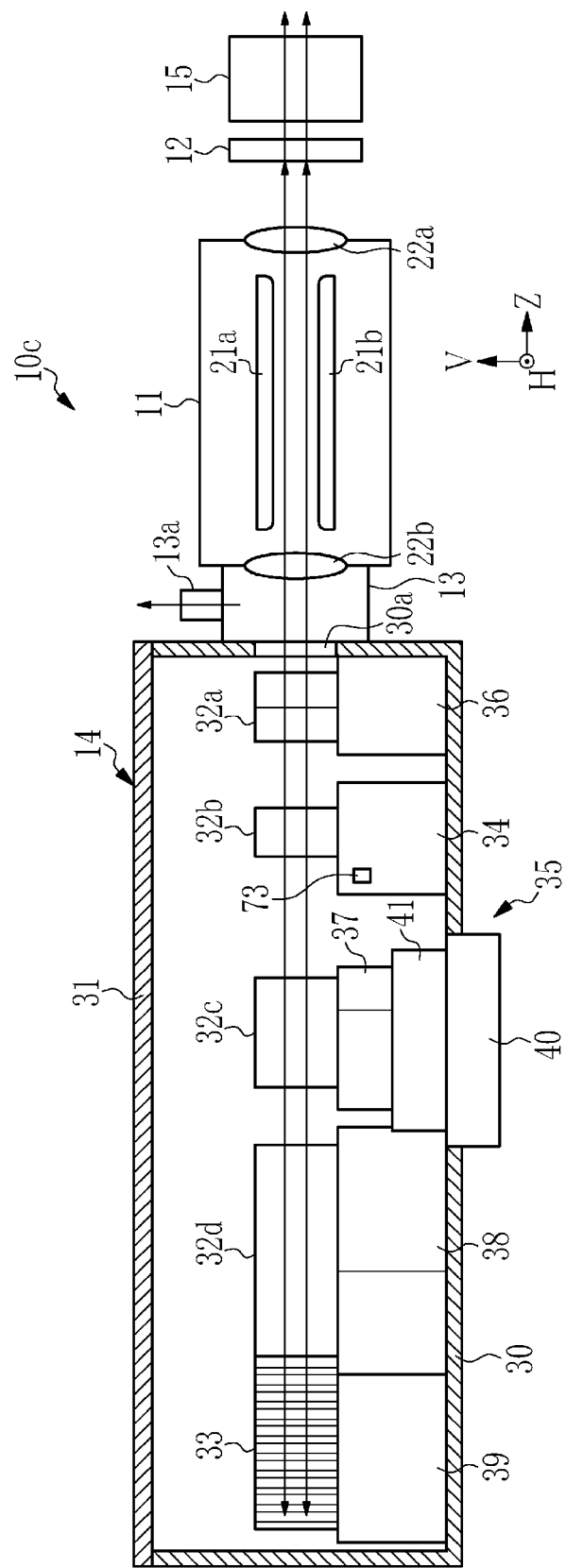
FIG. 15 is a side view of the laser apparatus according to the third embodiment viewed in the H direction.

FIGS. 14 and 15 schematically show a configuration of the laser apparatus 10c according to the third embodiment of the present disclosure. FIG. 14 is a top view of the laser apparatus 10c viewed in the V direction. FIG. 15 is a side view of the laser apparatus 10c viewed in the H direction.

In the laser apparatus 10c according to this embodiment, a capacitance position sensor 73 constitutes an angle sensor. The capacitance position sensor 73 is included in the fine adjustment rotary stage 34 as a piezo stage, and detects a position of the prism 32b to output a position signal. The position signal corresponds to an angle θ of the prism 32b. The position signal output from the capacitance position sensor 73 is input as a detected angle θ through a signal line 73a to the second control unit 62. The capacitance position sensor 73 is operated at the sampling rate fs2.

Other configurations and operations of the laser apparatus 10c according to this embodiment are the same as those of the laser apparatus 10a according to the first embodiment, and thus descriptions thereof are omitted.

4.2 Variant

As a variant of the laser apparatus 10c according to the third embodiment, a position detecting piezoelectric element such as PZT may be used in place of the capacitance position sensor 73. Like the capacitance position sensor 73, the position detecting piezoelectric element is included in the fine adjustment rotary stage 34. The position detecting piezoelectric element detects a position of the prism 32b to output a position signal. The position signal is input as a detected angle θ to the second control unit 62.

5. Fourth Embodiment

Next, a laser apparatus 10d according to a fourth embodiment of the present disclosure will be described. Hereinafter, substantially the same components as those of the laser apparatus 10a according to the first embodiment are denoted by the same reference characters, and descriptions thereof are omitted as appropriate.

In the first to third embodiments, the fine adjustment rotary stage 34 and the coarse adjustment rotary stage 35 are provided as wavelength selecting mechanisms for selecting the central wavelength of the laser beam, while in the fourth embodiment, one rotary stage is used for wavelength selection.

5.1 Configuration and Operation

Figure 16:
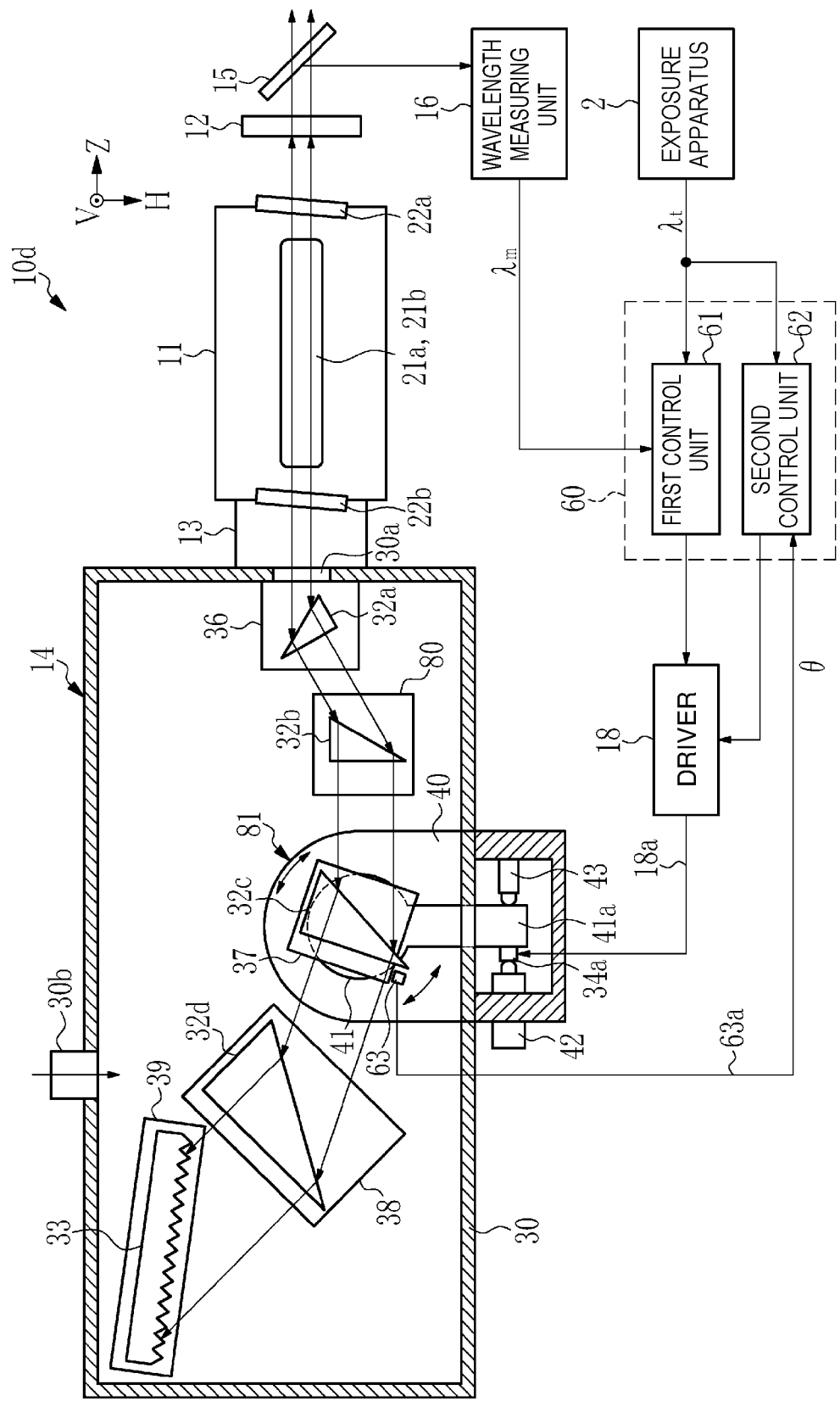
FIG. 16 is a top view of a laser apparatus according to a fourth embodiment viewed in the V direction.
Figure 17:
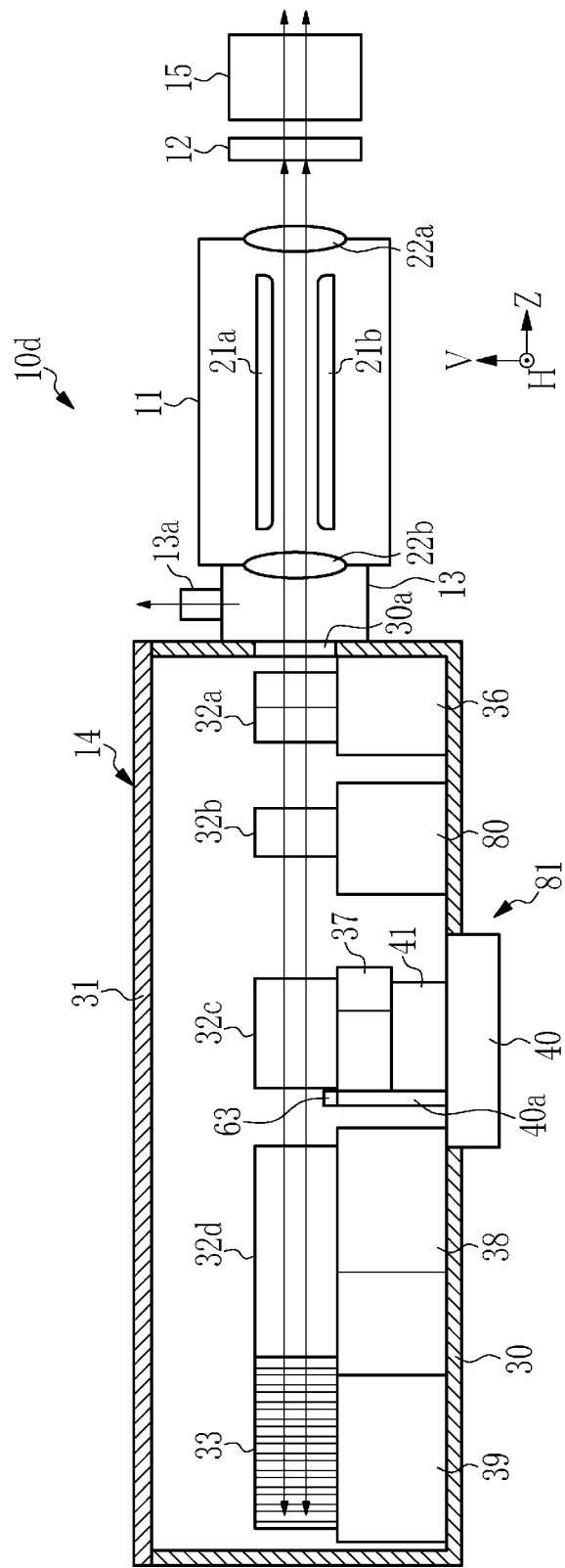
FIG. 17 is a side view of the laser apparatus according to the fourth embodiment viewed in the H direction.

FIGS. 16 and 17 schematically show a configuration of the laser apparatus 10d according to the fourth embodiment of the present disclosure. FIG. 16 is a top view of the laser apparatus 10d viewed in the V direction. FIG. 17 is a side view of the laser apparatus 10d viewed in the H direction.

In this embodiment, the prism 32b is held by a holder 80 in place of the fine adjustment rotary stage 34 and is fixedly arranged. In this embodiment, a rotary stage 81 is used for fine adjustment and coarse adjustment of the prism 32c. The rotary stage 81 includes a stationary plate 40, a rotary plate 41, a linear stepping motor 42, a plunger screw 43, a holder 37, a PZT actuator 34a, and an angle sensor 63. The stationary plate 40, the rotary plate 41, the linear stepping motor 42, the plunger screw 43, and the holder 37 have the same configurations as those in the first embodiment.

In this embodiment, the PZT actuator 34a as a piezo actuator is arranged between the linear stepping motor 42 and the lever 41a of the rotary plate 41. The PZT actuator 34a is deformed according to the applied voltage from the driver 18 to press the lever 41a to rotate the rotary plate 41. The linear stepping motor 42 presses the lever 41a via the PZT actuator 34a to rotate the rotary plate 41. As in the first embodiment, the PZT actuator 34a is used for fine adjustment and the linear stepping motor 42 is used for coarse adjustment.

In this embodiment, the angle sensor 63 is fixedly provided on a sensor holder 40a on the stationary plate 40. The angle sensor 63 detects an angle of one surface of the prism 32c, and transmits a signal indicating a detected angle θ through the signal line 63a to the second control unit 62. Control with the control unit 60 is the same as in the first embodiment. Other configurations and operations of the laser apparatus 10d according to this embodiment are the same as those of the laser apparatus 10a according to the first embodiment, and thus descriptions thereof are omitted.

6. Fifth Embodiment

Next, a laser apparatus according to a fifth embodiment of the present disclosure will be described. Hereinafter, substantially the same components as those of the laser apparatus 10a according to the first embodiment are denoted by the same reference characters, and descriptions thereof are omitted as appropriate.

In the first to fourth embodiments, the first FB control based on the actual measured value of the central wavelength of the laser beam and the second FB control based on the detected value of the angle of the prism are concurrently performed. In the fifth embodiment, only FB control based on a detected value of an angle of a prism is performed, and the FB control is corrected based on an actual measured value of a central wavelength of a laser beam.

6.1 Configuration

Figure 18:
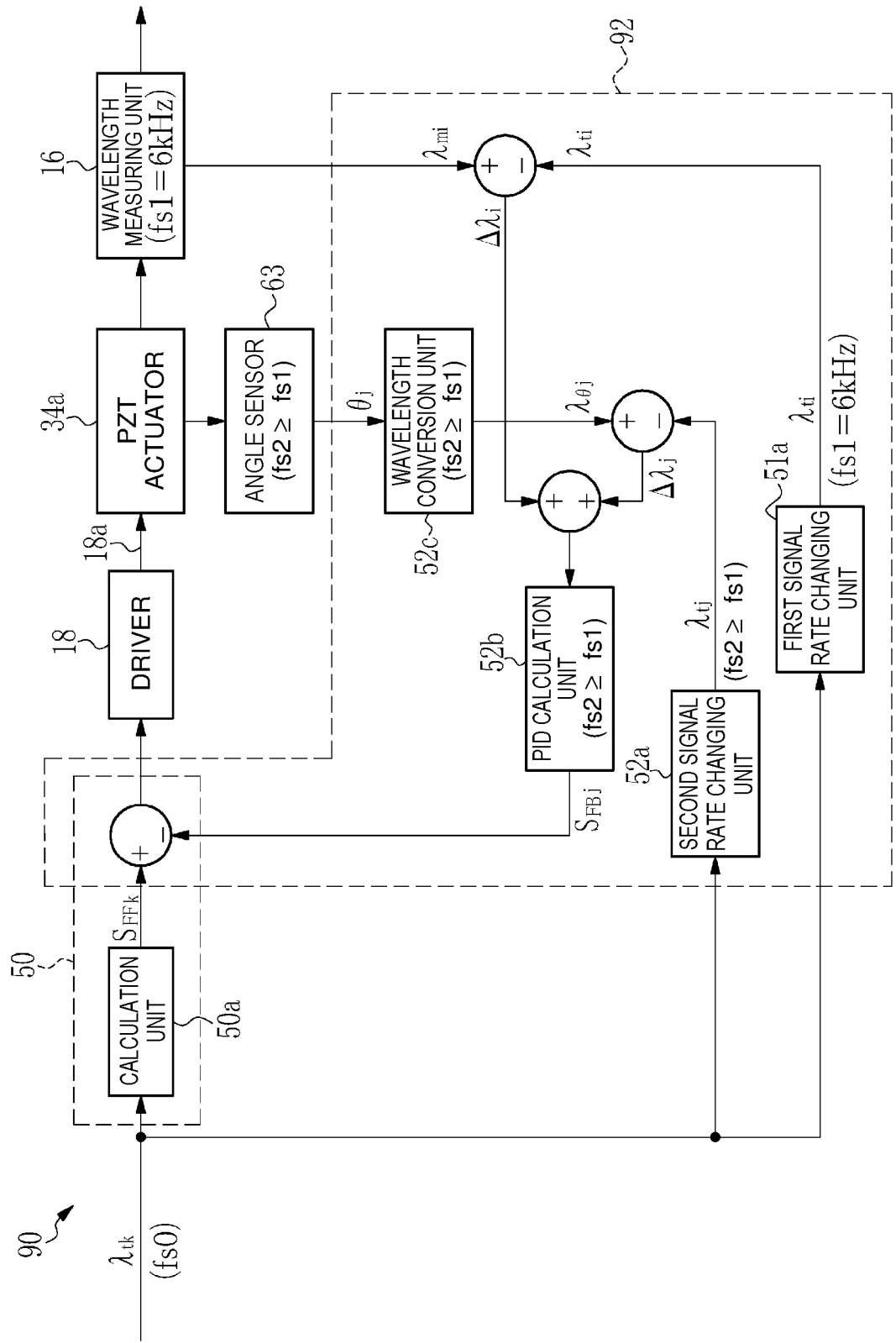
FIG. 18 is a block diagram of a configuration of a control unit used in a laser apparatus according to a fifth embodiment.

FIG. 18 schematically shows a configuration of a control unit 90 used in the laser apparatus according to the fifth embodiment of the present disclosure. The control unit 90 includes an FF unit 50 and an FB unit 92. The FF unit 50 has the same configuration as the FF unit 50 in the first embodiment. The FB unit 92 includes a first signal rate changing unit 51a, a second signal rate changing unit 52a, a PID calculation unit 52b, and a wavelength conversion unit 52c. The PID calculation unit 52b has the same configuration as the second PID calculation unit 52b in the first embodiment.

6.2 Operation

Figure 19:
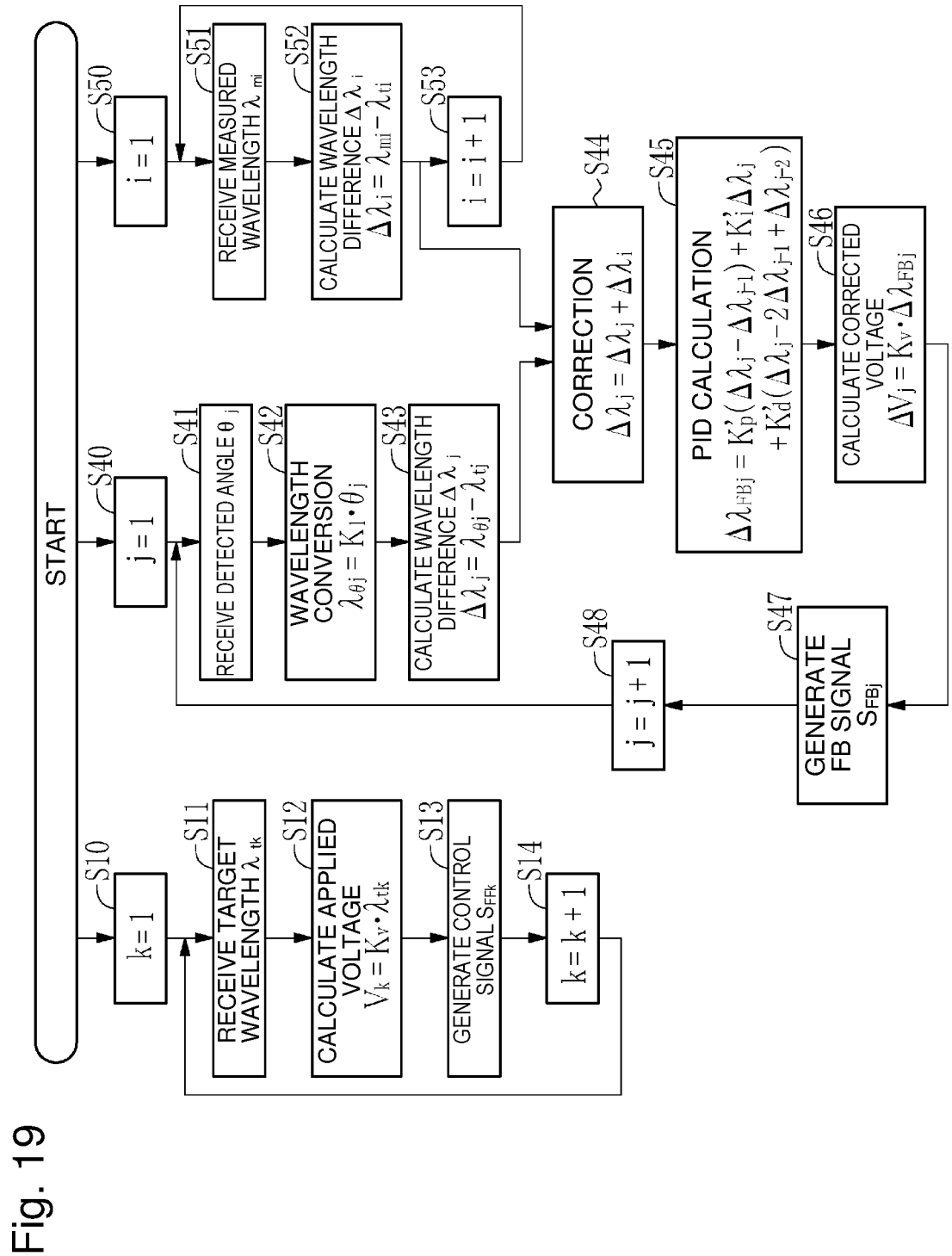
FIG. 19 is a flowchart of processing of control by the control unit.

FIG. 19 is a flowchart of processing of control by the control unit 90. The control unit 90 performs FF control and FB control based on a detected angle $\theta_j$ detected by the angle sensor 63. A measured wavelength $\lambda_{mi}$ measured by the wavelength measuring unit 16 is used for correction. The FF control in steps S10 to S14 is the same as that in the first embodiment, and thus descriptions thereof are omitted.

Now, the FB control in this embodiment will be described. In the FB control, the control unit 90 sets a parameter j to 1 (step S40), receives a signal indicating a detected angle $\theta_j$ from the angle sensor 63 (step S41), and then calculates a central wavelength $\lambda_{\theta j}$ of the laser beam with the wavelength conversion unit 52c (step S42). Then, the control unit 90 calculates a wavelength difference $\Delta\lambda_j$ between the calculated central wavelength $\lambda_{\theta j}$ and a target wavelength $\lambda_{tj}$ (step S43). The wavelength difference $\Delta\lambda_j$ is hereinafter referred to as a first wavelength difference $\Delta\lambda_j$.

Concurrently with steps S40 to S43, the control unit 90 performs the following processes. First, the control unit 90 sets a parameter i to 1 (step S50), receives a signal indicating a measured wavelength $\lambda_{mi}$ from the wavelength measuring unit 16 (step S51), and then calculates a wavelength difference $\Delta\lambda_i$ between the measured wavelength $\lambda_{mi}$ and a target wavelength $\lambda_{ti}$ (step S52). The wavelength difference $\Delta\lambda_i$ is hereinafter referred to as a second wavelength difference $\Delta\lambda_i$.

The control unit 90 calculates the first wavelength difference $\Delta\lambda_j$ in step S43, and calculates the second wavelength difference $\Delta\lambda_i$ in step S52, and then replaces the first wavelength difference $\Delta\lambda_j$ with the first wavelength difference $\Delta\lambda_j$ plus the second wavelength difference $\Delta\lambda_i$ (step S44). The first wavelength difference $\Delta\lambda_j$ is calculated at the sampling rate fs2, and the second wavelength difference $\Delta\lambda_i$ is calculated at the sampling rate fs1. Correction in step S44 is performed for the first wavelength difference $\Delta\lambda_j$ having been obtained when the second wavelength difference $\Delta\lambda_i$ is obtained.

Then, the PID calculation unit 52b performs PID calculation using the first wavelength difference $\Delta\lambda_j$ obtained in step S44 based on Expression (6) above to calculate a difference value $\Delta\lambda_{FBj}$ (step S45). When the second wavelength difference $\Delta\lambda_i$ has not been obtained, the PID calculation unit 52b performs PID calculation using the first wavelength difference $\Delta\lambda$, as it is, obtained in step S43. Then, the control unit 90 performs processes in steps S46 to S48, and returns the processing to step S41. Steps S46 to S48 are the same as steps S35 to S37 in the first embodiment.

In this embodiment, the second wavelength difference $\Delta\lambda_i$ obtained based on the measured wavelength $\lambda_{mi}$ is used to correct the first wavelength difference $\Delta\lambda_j$, and this corresponds to correcting a relationship between the detected angle $\theta_j$ and the central wavelength $\lambda_\theta$ based on the measured wavelength $\lambda_{mi}$. Thus, in place of the correction in step S44, the relationship between the detected angle $\theta_j$ and the central wavelength $\lambda_\theta$ may be directly corrected based on the measured wavelength $\lambda_{mi}$.

6.3 Effect

In this embodiment, the relationship between the detected angle $\theta_j$ and the central wavelength $\lambda_{\theta j}$ is corrected based on the measured wavelength $\lambda_{mi}$. This allows stable control against thermal wavelength disturbance measured by the wavelength measuring unit 16 in addition to the effect of the laser apparatus 10a according to the first embodiment.

The control unit 90 in this embodiment is applicable to the laser apparatuses according to the second to fourth embodiments, not limited to the laser apparatus according to the first embodiment.

In the first to fourth embodiments, the first control unit 61 and the second control unit 62 included in the control unit 60 are different components, but may be configured as one control unit. Also, the control units 60 and 90 may each be a control circuit of a CPU or the like executing a program read from a memory, not limited to hardware of a semiconductor circuit or the like. Further, the control units 60 and 90 may each be a programmable gate array such as a field-programmable gate array (FPGA).

In the first to fourth embodiments, the first control unit 61 and the second control unit 62 control the PZT actuator 34a with one driver 18, but the number of drivers is not limited to one. The driver may be provided for each of the first control unit 61 and the second control unit 62.

In the first to fifth embodiments, the four prisms 32a to 32d are provided in the line narrowing module 14, but the number of prisms is not limited to four as long as at least one prism is provided.

7. Others

Figure 20:
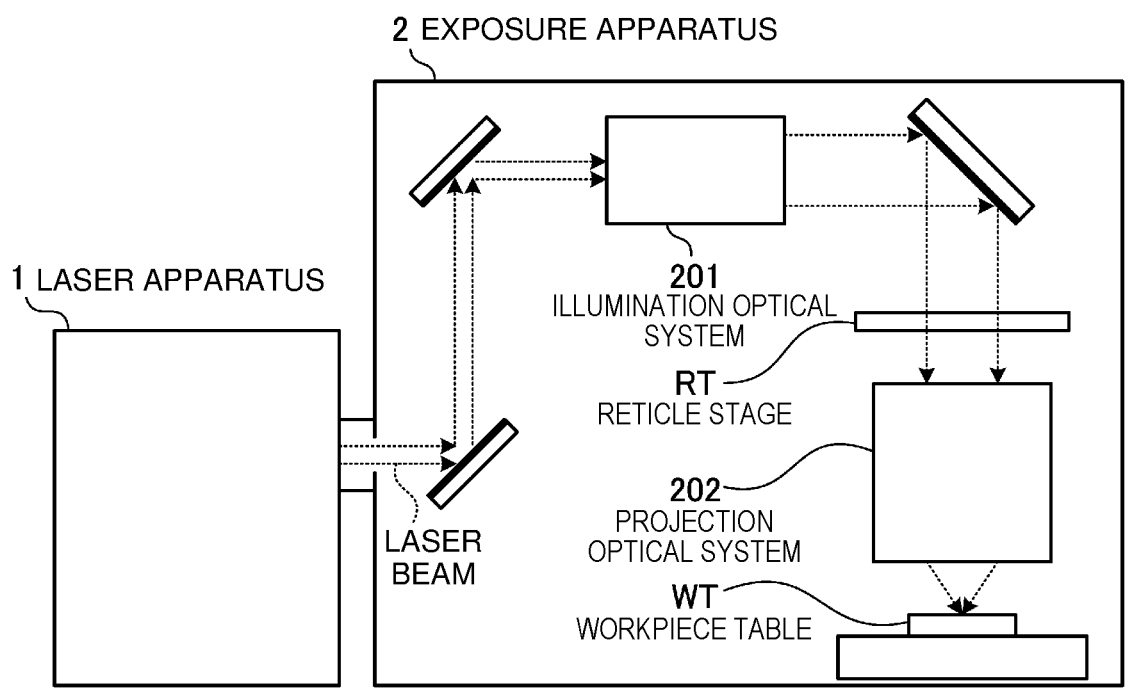
FIG. 20 schematically shows a configuration of an exposure apparatus connected to a laser apparatus.

FIG. 20 schematically shows a configuration of an exposure apparatus 2 connected to a laser apparatus 1. As described above, the laser apparatus 1 generates a laser beam and outputs the laser beam to the exposure apparatus 2.

In FIG. 20, the exposure apparatus 2 includes an illumination optical system 201 and a projection optical system 202. The illumination optical system 201 illuminates a reticle pattern on a reticle stage RT with a laser beam incident from the laser apparatus 1. The projection optical system 202 reduces and projects the laser beam having passed through the reticle and forms an image thereof on a workpiece (not shown) arranged on a workpiece table WT. The workpiece is a photosensitive substrate such as a semiconductor wafer coated with photoresist. The exposure apparatus 2 synchronously translates the reticle stage RT and the workpiece table WT to expose the workpiece to the laser beam reflecting the reticle pattern. Through the exposure process as described above, a device pattern is transferred onto the semiconductor wafer, thereby allowing an electronic device to be manufactured.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more."

What is claimed is:

1. A laser apparatus comprising:
   A. an output coupling mirror;
   B. a grating that constitutes an optical resonator together with the output coupling mirror;
   C. a laser chamber arranged in an optical path of the optical resonator;
   D. at least one prism arranged in an optical path between the laser chamber and the grating;
   E. a rotary stage including an actuator configured to rotate the prism to change an incident angle of a laser beam output from the laser chamber on the grating;
   F. a wavelength measuring unit configured to measure a central wavelength of the laser beam output from the laser chamber through the output coupling mirror;
   G. an angle sensor configured to detect a rotation angle of the prism; and H. a control unit configured to convert a detected angle detected by the angle sensor into a converted wavelength, to correct a relationship between the detected angle and the converted wavelength to calculate a corrected relationship based on a measured wavelength measured by the wavelength measuring unit, and to perform feedback control of the actuator based on the corrected relationship and a difference between the converted wavelength and a target wavelength input from an external device.

2. The laser apparatus according to claim 1, wherein the control unit includes a first signal rate changing unit configured to change a sampling rate of a signal indicating the target wavelength to be equal to a sampling rate of the wavelength measuring unit.

3. The laser apparatus according to claim 2, wherein the control unit includes a second signal rate changing unit configured to change the sampling rate of the signal indicating the target wavelength to be equal to a sampling rate of the angle sensor.

4. An electronic device manufacturing method comprising:
   generating a pulse laser beam with a laser apparatus;
   outputting the pulse laser beam to an exposure apparatus; and
   exposing the pulse laser beam onto a photosensitive substrate within the exposure apparatus to manufacture an electronic device, the laser apparatus including A. an output coupling mirror,
B. a grating that constitutes an optical resonator together with the output coupling mirror,
C. a laser chamber arranged in an optical path of the optical resonator,
D. at least one prism arranged in an optical path between the laser chamber and the grating,
E. a rotary stage including an actuator configured to rotate the prism to change an incident angle of a laser beam output from the laser chamber on the grating,
F. a wavelength measuring unit configured to measure a central wavelength of the laser beam output from the laser chamber through the output coupling mirror,
G. an angle sensor configured to detect a rotation angle of the prism, and
H. a control unit configured to convert a detected angle detected by the angle sensor into a converted wavelength, to correct a relationship between the detected angle and the converted wavelength to calculate a corrected relationship based on a measured wavelength measured by the wavelength measuring unit, and to perform feedback control of the actuator based on the corrected relationship and a difference between the converted wavelength and a target wavelength input from an external device.

\* \* \* \* \*